(12) United States Patent
Maejima

(10) Patent No.: US 12,230,331 B2
(45) Date of Patent: Feb. 18, 2025

(54) MEMORY DEVICE

(71) Applicant: Kioxia Corporation, Tokyo (JP)

(72) Inventor: Hiroshi Maejima, Setagaya Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 160 days.

(21) Appl. No.: 17/901,459

(22) Filed: Sep. 1, 2022

(65) Prior Publication Data

US 2023/0298673 A1  Sep. 21, 2023

(30) Foreign Application Priority Data

Feb. 28, 2022 (JP) .................................. 2022-029798

(51) Int. Cl.
| | |
|---|---|
| G11C 16/26 | (2006.01) |
| H01L 23/00 | (2006.01) |
| H01L 25/065 | (2023.01) |
| H01L 25/18 | (2023.01) |

(52) U.S. Cl.
CPC .............. *G11C 16/26* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ..... G11C 16/26; H01L 24/08; H01L 25/0657; H01L 25/18; H01L 2224/08145; H01L 2924/1431; H01L 2924/14511
USPC ...................................................... 365/185.21
See application file for complete search history.

(56) References Cited

U.S. PATENT DOCUMENTS

| | | |
|---|---|---|
| 2016/0232963 A1 | 8/2016 | Antonyan |
| 2018/0122466 A1 | 5/2018 | Terada et al. |
| 2020/0082872 A1* | 3/2020 | Seo .................... G11C 11/4091 |
| 2021/0125660 A1 | 4/2021 | Maejima |

FOREIGN PATENT DOCUMENTS

| | | |
|---|---|---|
| JP | 2021-072313 A | 5/2021 |
| TW | 201703045 A | 1/2017 |

* cited by examiner

*Primary Examiner* — Huan Hoang
(74) *Attorney, Agent, or Firm* — Foley & Lardner LLP

(57) ABSTRACT

A memory device includes a first memory cell and a second memory cell each corresponding to a first column address, a first sense amplifier unit, a first bit line connected between the first memory cell and the first sense amplifier unit, and a second bit line connected between the second memory cell and the first sense amplifier unit.

19 Claims, 23 Drawing Sheets

FIG. 10

| | | TIER TO WHICH SENSE AMPLIFIER UNIT CORRESPONDING TO BIT LINE BELONG | | | | | | | |
|---|---|---|---|---|---|---|---|---|---|
| | | T<0> | T<1> | T<2> | T<3> | T<4> | T<5> | T<6> | T<7> |
| TIER CORRE- SPONDING TO BLOCK LOCATION | +Y SIDE OF T<0> | BLa | | | | | | | |
| | T<0> | BLa | | | | | | | |
| | T<1> | BLb | BLa | | | | | | |
| | T<2> | BLb | | BLa | | | | | |
| | T<3> | BLb | | | BLa | | | | |
| | T<4> | BLb | | | | BLa | | | |
| | T<5> | BLb | | | | | BLa | | |
| | T<6> | BLb | | | | | | BLa | |
| | T<7> | BLb | | | | | | | BLa |
| | -Y SIDE OF T<7> | BLb | | | | | | | |

FIG. 18

| | | \multicolumn{8}{c}{TIER TO WHICH SENSE AMPLIFIER UNIT CORRESPONDING TO BIT LINE BELONG} |
|---|---|---|---|---|---|---|---|---|---|
| | | T<0> | T<1> | T<2> | T<3> | T<4> | T<5> | T<6> | T<7> |
| TIER CORRE- SPONDING TO BLOCK LOCATION | +Y SIDE OF T<0> | BLa | | | | | | | |
| | T<0> | BLa | | | | | | | |
| | T<1> | BLb | BLa | | | | | | |
| | T<2> | BLb | BLa | | | | | | |
| | T<3> | BLb | | | BLa | | | | |
| | T<4> | BLb | | | BLa | | | | |
| | T<5> | BLb | | | | | | BLa | |
| | T<6> | BLb | | | | | | BLa | |
| | T<7> | BLb | | | | | | | |
| | -Y SIDE OF T<7> | BLb | | | | | | | |

FIG. 20

| | | TIER TO WHICH SENSE AMPLIFIER UNIT CORRESPONDING TO BIT LINE BELONG | | | | | | | |
|---|---|---|---|---|---|---|---|---|---|
| | | T<0> | T<1> | T<2> | T<3> | T<4> | T<5> | T<6> | T<7> |
| TIER CORRE- SPONDING TO BLOCK LOCATION | +Y SIDE OF T<0> | BLa | | | | | | | |
| | T<0> | BLa | | | | | | | |
| | T<1> | BLa | | | | | | | |
| | T<2> | BLb | | | | BLa | | | |
| | T<3> | BLb | | | | BLa | | | |
| | T<4> | BLb | | | | BLa | | | |
| | T<5> | BLb | | | | BLa | | | |
| | T<6> | BLb | | | | | | | |
| | T<7> | BLb | | | | | | | |
| | -Y SIDE OF T<7> | BLb | | | | | | | |

MEMORY DEVICE

CROSS-REFERENCE TO RELATED APPLICATION(S)

This application is based upon and claims the benefit of priority from Japanese Patent Application No. 2022-029798, filed Feb. 28, 2022, the entire contents of which are incorporated herein by reference.

FIELD

Embodiments described herein relate generally to a memory device.

BACKGROUND

A NAND flash memory is known as a memory device capable of storing data in a non-volatile manner. In a memory device, such as a NAND flash memory, a three-dimensional memory structure is employed for high integration and high capacity. The three-dimensional memory structure and a peripheral circuit for controlling the memory structure may be provided on separate chips, respectively. In this case, the memory device is formed by bonding the chip provided with the three-dimensional memory structure to the chip provided with the peripheral circuit together.

DESCRIPTION OF THE DRAWINGS

FIG. 10 is a diagram illustrating an example of a connection relationship between the sense amplifier units, blocks, and bit lines of the memory device according to the first embodiment.

FIG. 18 is a diagram illustrating an example of a connection relationship between the sense amplifier units, blocks, and bit lines of the memory device according to the second embodiment.

FIG. 20 is a diagram illustrating an example of a connection relationship between the sense amplifier units, blocks, and bit lines of the memory device according to the third embodiment.

DETAILED DESCRIPTION

Figure 1:
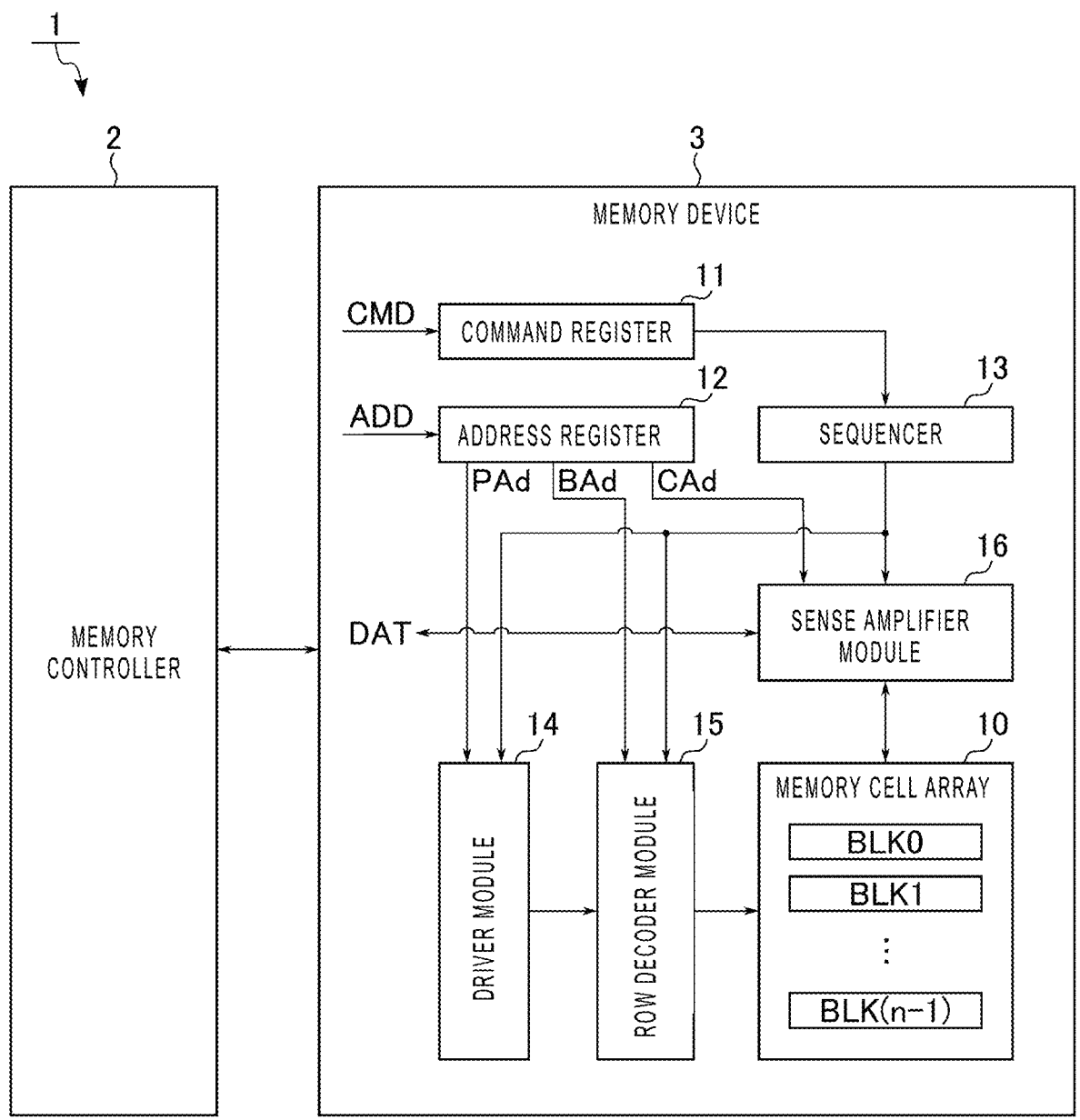
FIG. 1 is a block diagram illustrating a configuration of a memory system including a memory device according to a first embodiment.

At least one embodiment provides an increase in current consumption and reduces a circuit area.

In general, according to at least one embodiment, a memory device includes a first memory cell and a second memory cell each corresponding to a first column address, a first sense amplifier unit, a first bit line connected between the first memory cell and the first sense amplifier unit, and a second bit line connected between the second memory cell and the first sense amplifier unit.

Hereinafter, embodiments will be described with reference to the drawings.

In the following description, the same reference numerals will be given to components having substantially the same functions and structures. When especially distinguishing elements having the same configuration from each other, different characters or numbers may be added to the end of the same reference numeral.

1. First Embodiment

A first embodiment will be described.
1.1 Configuration
A configuration according to the first embodiment will be described.
1.1.1 Memory System
FIG. 1 is a block diagram illustrating a configuration of a memory system according to a first embodiment. The memory system is a storage device configured to be connected to an external host device (not illustrated). The memory system is, for example, a memory card such as an SD™ card, a universal flash storage (UFS), or a solid state drive (SSD). The memory system 1 includes a memory controller 2 and a memory device 3.

The memory controller 2 is configured with, for example, an integrated circuit such as a system-on-a-chip (SoC). The memory controller 2 controls the memory device 3 based on a request from the host device. Specifically, for example, the memory controller 2 writes data, requested to be written by the host device, to the memory device 3. Further, the memory controller 2 reads data, requested to be read by the host device, from the memory device 3 and transmits the data to the host device.

The memory device 3 is a memory that stores data in a non-volatile manner. The memory device 3 is, for example, a NAND-type flash memory.

Communication between the memory controller 2 and the memory device 3 conforms to, for example, a single data rate (SDR) interface, a toggle double data rate (DDR) interface, or an open NAND flash interface (ONFI).
1.1.2 Memory Device
Next, a configuration of the memory device according to the first embodiment will be described.
1.1.2.1 Overall Configuration of Memory Device
Next, the overall configuration of the memory device according to the first embodiment will be described with reference to the block diagram illustrated in FIG. 1. The memory device 3 includes, for example, a memory cell array 10, a command register 11, an address register 12, a sequencer 13, a driver module 14, a row decoder module 15, and a sense amplifier module 16.

The memory cell array 10 is a data storage region. The memory cell array 10 includes a plurality of blocks BLK0 to BLK (n−1) (n is an integer of 2 or more). The block BLK is a set of a plurality of memory cells. The block BLK is used as, for example, the erase unit of data. Each of the plurality of memory cells stores data in a non-volatile manner. Further, a plurality of bit lines and a plurality of word lines are provided in the memory cell array 10. Each memory cell is associated with, for example, one bit line and one word line. A detailed configuration of the memory cell array 10 will be described later.

The command register 11 stores a command CMD received by the memory device 3 from the memory controller 2. The command CMD includes, for example, a command for causing the sequencer 13 to execute a read operation, a write operation, or an erase operation.

The address register 12 stores address information ADD received by the memory device 3 from the memory controller 2. The address information ADD includes, for example, a block address BAd, a page address PAd, and a column address CAd. For example, the block address BAd, the page address PAd, and the column address CAd are used for the selection of the block BLK, the word line, and the bit line, respectively.

The sequencer 13 controls an operation of the entire memory device 3. For example, the sequencer 13 controls the driver module 14, the row decoder module 15, and the sense amplifier module 16 based on the command CMD stored in the command register 11 to execute a read operation, a write operation, or an erase operation.

The driver module 14 generates a voltage used in a read operation, a write operation, or an erase operation. Then, the driver module 14 applies the generated voltage to a signal line corresponding to a selected word line, for example, based on the page address PAd stored in the address register 12.

The row decoder module 15 selects one block BLK in the corresponding memory cell array 10 based on the block address BAd stored in the address register 12. Then, the row decoder module 15 transfers, for example, the voltage applied to the signal line corresponding to the selected word line to a selected word line in the selected block BLK.

Figure 2:
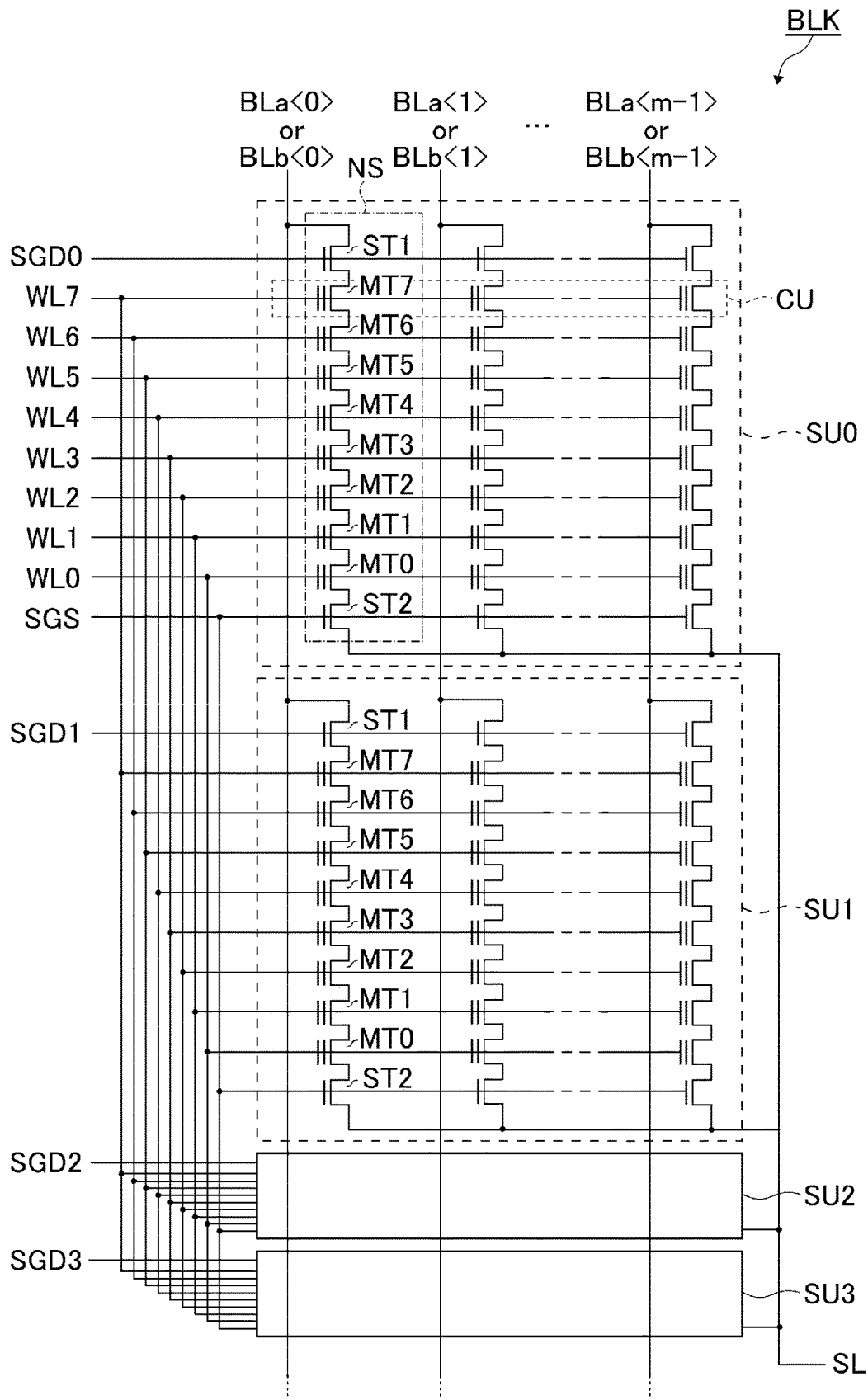
FIG. 2 is a circuit diagram illustrating an example of a configuration of a memory cell array of the memory device according to the first embodiment.

The sense amplifier module 16 selects a bit line in the corresponding memory cell array 10 based on the column address CAd stored in the address register 12. In a write operation, the sense amplifier module 16 applies a desired voltage to each bit line according to write data DAT received from the memory controller 2. Further, in a read operation, the sense amplifier module 16 determines data stored in the memory cell based on the voltage of the bit line, and transfers the determination result to the memory controller 2 as read data DAT.
1.1.3 Circuit Configuration of Memory Device
Next, a circuit configuration of the memory device according to the first embodiment will be described.
1.1.3.1 Circuit Configuration of Memory Cell Array
FIG. 2 is a circuit diagram illustrating an example of a circuit configuration of the memory cell array provided in the memory device according to the first embodiment. In FIG. 2, one block BLK among the plurality of blocks BLK provided in the memory cell array 10 is illustrated. As illustrated in FIG. 2, the block BLK includes, for example, four string units SU0 to SU3.

Each string unit SU includes a plurality of NAND strings NS associated respectively with a bit line BLa<0> or BLb<0>, BLa<1> or BLb<1>, . . . , and BLa<m−1> or BLb<m−1> (m is an integer of 2 or more). Each NAND string NS includes, for example, memory cell transistors MT0 to MT7 and select transistors ST1 and ST2. Each memory cell transistor MT includes a control gate and a charge storage unit, and stores data in a non-volatile manner. Each of the select transistors ST1 and ST2 is used for the selection of the string unit SU in various operations.

]In each NAND string NS, the memory cell transistors MT0 to MT7 are connected in series. A first end of the select transistor ST1 is connected to any one of associated bit lines BLa and BLb. A second end of the select transistor ST1 is connected to a first end of the memory cell transistors MT0 to MT7 connected in series. A first end of the select transistor ST2 is connected to a second end of the memory cell transistors MT0 to MT7 connected in series. A second end of the select transistor ST2 is connected to a source line SL.

In the same block BLK, the control gates of the memory cell transistors MT0 to MT7 are connected to word lines WL0 to WL7, respectively. The gates of the select transistors ST1 in the string units SU0 to SU3 are connected to select gate lines SGD0 to SGD3, respectively. The gates of a plurality of select transistors ST2 are connected to a select gate line SGS.

The same column address CAd is assigned to a group of the bit line BLa and the bit line BLb. Hereinafter, the same reference character <k> will be given to the group of the bit lines BLa and BLb to which the same column address CAd is assigned ($0 \leq k \leq m-1$). The column address CAd assigned to the bit lines BLa<0> and BLb<0>, the column address CAd assigned to the bit lines BLa<1> and BLb<1>, ..., and the column address CAd assigned to the bit lines BLa<m−1> and BLb<m−1> are different from each other.

Each of a plurality of groups of the bit lines BLa and BLb is shared by the NAND strings NS to which the same column address is assigned among the plurality of blocks BLK. Each of the word lines WL0 to WL7 is provided for each block BLK. The source line SL is shared, for example, among the plurality of blocks BLK.

A set of a plurality of memory cell transistors MT connected to a common word line WL in one string unit SU is referred to as, for example, a cell unit CU. For example, the storage capacity of the cell unit CU including the memory cell transistors MT each storing 1-bit data is defined as "one page data". The cell unit CU may have a storage capacity of two pages or more data according to the number of bits of data stored in the memory cell transistor MT.

The circuit configuration of the memory cell array 10 provided in the memory device 3 according to the first embodiment is not limited to the configuration described above. For example, the number of string units SU provided in each block BLK may be designed to an any number. The number of memory cell transistors MT and the number of select transistors ST1 and ST2 provided in each NAND string NS may be designed to an any number, respectively.

1.1.3.2 Circuit Configuration of Sense Amplifier Module

Figure 3:
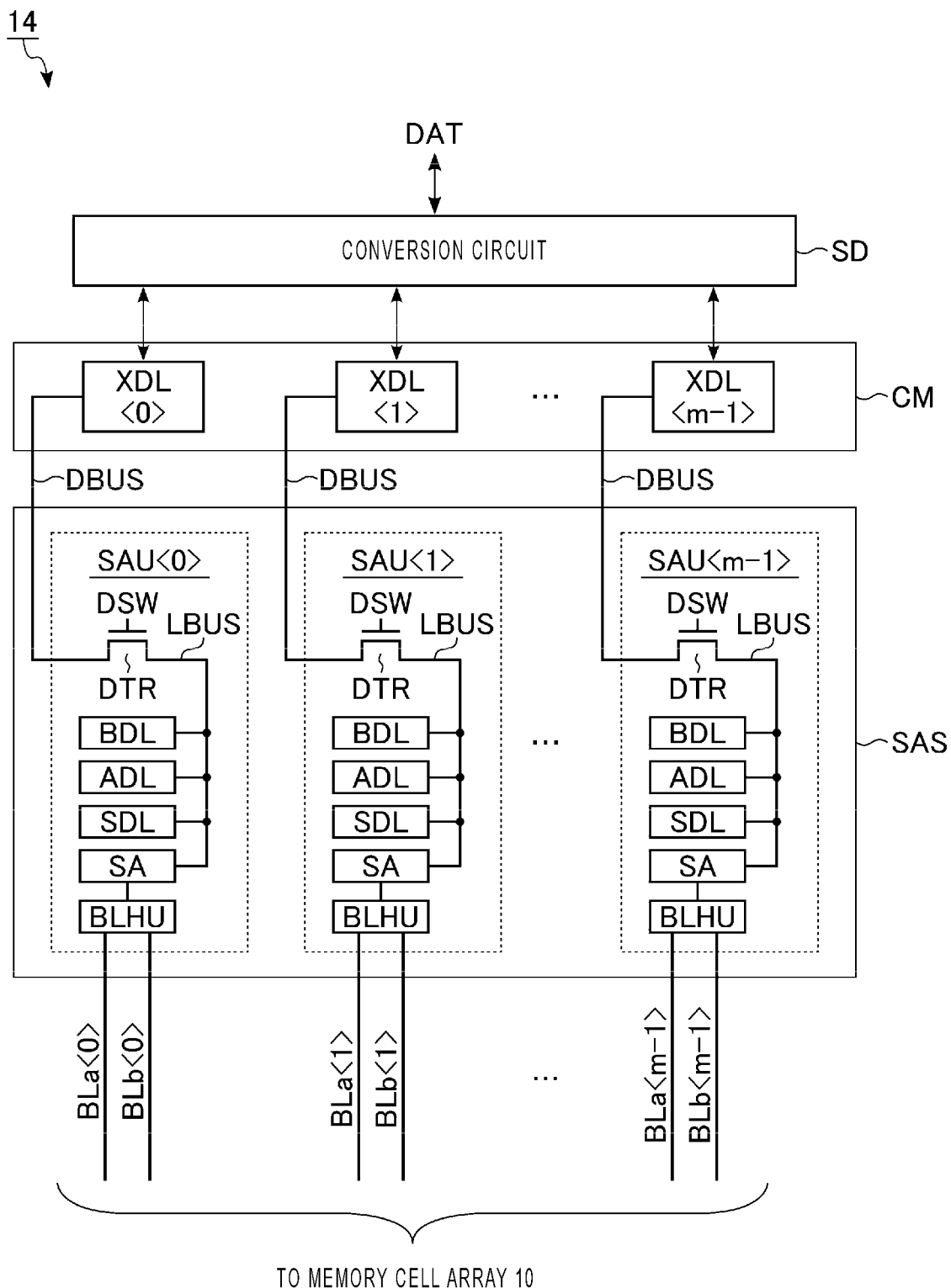
FIG. 3 is a circuit diagram illustrating an example of a configuration of a sense amplifier module of the memory device according to the first embodiment.

FIG. 3 is a circuit diagram illustrating an example of a circuit configuration of a sense amplifier module of the memory device according to the first embodiment. The sense amplifier module 16 includes a conversion circuit SD, a cache memory CM, and a sense amplifier set SAS.

The conversion circuit SD is a parallel-to-serial conversion circuit (SerDes). Specifically, the conversion circuit SD transfers the data DAT, serially transferred from the memory controller 2 via an input/output circuit (not illustrated) in the memory device 3, in parallel to the cache memory CM. Further, the conversion circuit SD serially transfers the data DAT received in parallel from the cache memory CM to the input/output circuit.

The cache memory CM includes a plurality of latch circuits XDL<0> to XDL<m−1>. Each latch circuit XDL temporarily stores the data DAT in a read operation and a write operation.

The sense amplifier set SAS includes a plurality of sense amplifier units SAU<0> to SAU<m−1>. The plurality of sense amplifier units SAU<0> to SAU<m−1> are connected, respectively, to the plurality of latch circuits XDL<0> to XDL<m−1> via different buses DBUS. Further, the plurality of sense amplifier units SAU<0> to SAU<m−1> are connected, respectively, to the bit lines BLa<0> to BLa<m−1> and BLb<0> to BLb<m−1>. Specifically, the sense amplifier unit SAU<0> is connected to the bit lines BLa<0> and BLb<0>. The sense amplifier unit SAU<1> is connected to the bit lines BLa<1> and BLb<1>. The sense amplifier unit SAU<m−1> is connected to the bit lines BLa<m−1> and BLb<m−1>.

Each sense amplifier unit SAU includes a transistor DTR, a bus LBUS, latch circuits SDL, ADL, and BDL, a sense amplifier SA, and a bit line connector BLHU. Hereinafter, a circuit configuration of the sense amplifier unit SAU will be described with a focus on one sense amplifier unit SAU.

The transistor DTR is connected between the buses LBUS and DBUS. A signal DSW is input to the gate of the transistor DTR. The transistor DTR controls whether the sense amplifier unit SAU and the latch circuit XDL are electrically connected or isolated according to whether the signal DSW is at the "H" level or the "L" level.

The bus LBUS is a bus that is connected between the transistor DTR, the sense amplifier SA, and the latch circuits SDL, ADL, and BDL.

The latch circuits SDL, ADL, and BDL temporarily store read data or write data. The latch circuits SDL, ADL, and BDL transmit and receive data to and from the sense amplifier SA via the bus LBUS.

For example, in a read operation, the sense amplifier SA determines whether read data is "0" or "1" based on the voltages of the corresponding bit lines BLa and BLb. Further, for example, in a write operation, the sense amplifier SA may change the voltages applied to the corresponding bit lines BLa and BLb based on data stored in the latch circuit SDL.

The bit line connector BLHU includes a high withstand voltage transistor. The bit line connector BLHU is connected between the sense amplifier SA and the corresponding bit lines BLa and BLb.

Next, details of a configuration of the sense amplifier SA will be described with reference to FIG. 4.

Figure 4:
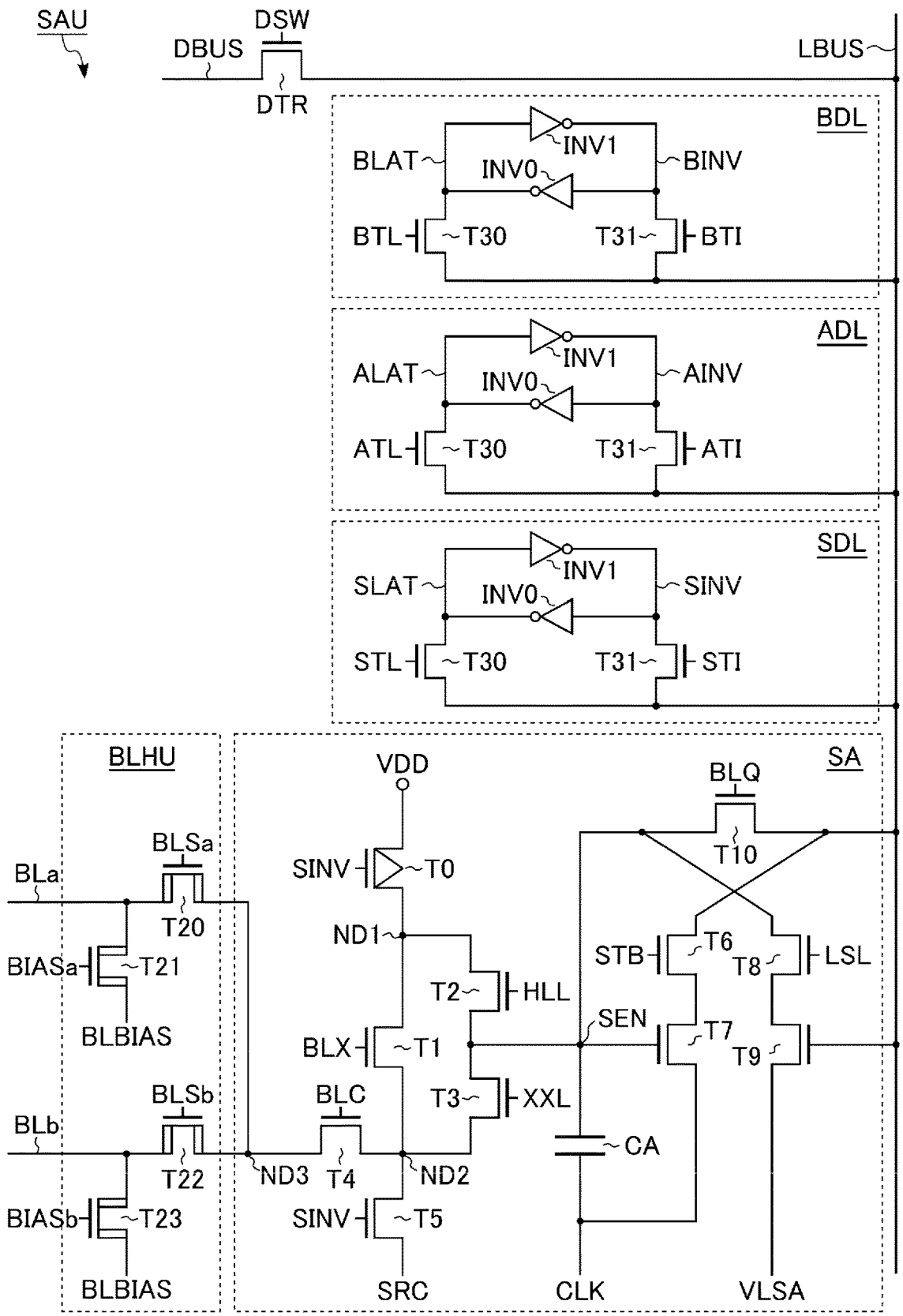
FIG. 4 is a circuit diagram illustrating an example of a configuration of a sense amplifier unit of the sense amplifier module of the memory device according to the first embodiment.

FIG. 4 is a circuit diagram illustrating an example of a configuration of the sense amplifier unit of the sense amplifier module of the memory device according to the first embodiment. As illustrated in FIG. 4, the sense amplifier SA includes transistors T0 to T10 and a capacitor CA. The bit line connector BLHU includes transistors T20 to T23. Each of the latch circuits SDL, ADL, and BDL includes, for example, transistors T30 and T31 and inverters INV0 and INV1. The latch circuits SDL, ADL, and BDL have configurations similar to each other.

The transistor T0 is a P-type MOS transistor. The transistors T1 to T10, T20 to T23, T30, and T31 are N-type MOS transistors. The withstand voltages of the transistors T20 to T23 are higher than the withstand voltages of the transistors T1 to T10. Hereinafter, the transistors T0 to T10 are also referred to as low withstand voltage transistors. The transistors T20 to T23 are also referred to as high withstand voltage transistors.

First, a connection relationship between elements in the sense amplifier SA will be described.

A voltage VDD is supplied to a first end of the transistor T0. The voltage VDD is a power supply voltage. A second end of the transistor T0 is connected to a node ND1. The gate of the transistor T0 is connected to a node SINV.

A first end of the transistor T1 is connected to the node ND1. A second end of the transistor T1 is connected to a node ND2. A signal BLX is supplied to the gate of the transistor T1.

A first end of the transistor T2 is connected to the node ND1. A second end of the transistor T2 is connected to a node SEN. A signal HLL is supplied to the gate of the transistor T2.

A first end of the transistor T3 is connected to the node SEN. A second end of the transistor T3 is connected to the node ND2. A signal XXL is supplied to the gate of the transistor T3.

A first end of the transistor T4 is connected to the node ND2. A second end of the transistor T4 is connected to a node ND3. A signal BLC is input to the gate of the transistor T4.

A first end of the transistor T5 is connected to the node ND2. A second end of the transistor T5 is connected to a node SRC. The node SRC is grounded, for example. The gate of the transistor T5 is connected to a node SINV.

A first end of the transistor T6 is connected to the bus LBUS. A second end of the transistor T6 is connected to a first end of the transistor T7. A signal STB is supplied to the gate of the transistor T6. A second end of the transistor T7 is connected to a node CLK. The gate of the transistor T7 is connected to the node SEN.

A first end of the transistor T8 is connected to the node SEN. A second end of the transistor T8 is connected to a first end of the transistor T9. A signal LSL is input to the gate of the transistor T8. A second end of the transistor T9 is connected to a node VLSA. For example, the node VLSA is grounded. The gate of the transistor T9 is connected to the bus LBUS.

A first end of the transistor T10 is connected to the bus LBUS. A second end of the transistor T10 is connected to the node SEN. A signal BLQ is supplied to the gate of the transistor T10.

A first end of the capacitor CA is connected to the node SEN. A second end of the capacitor CA is connected to the node CLK. For example, a clock signal is input to the node CLK.

Next, a connection relationship between elements in the bit line connector BLHU will be described.

A first end of the transistor T20 is connected to the node ND3. A second end of the transistor T20 is connected to the corresponding bit line BLa. A signal BLSa is supplied to the gate of the transistor T20.

A first end of the transistor T21 is connected to a node BLBIAS. A second end of the transistor T21 is connected to the corresponding bit line BLa. A signal BIASa is supplied to the gate of the transistor T21.

A first end of the transistor T22 is connected to the node ND3. A second end of the transistor T22 is connected to the corresponding bit line BLb. A signal BLSb is supplied to the gate of the transistor T22.

A first end of the transistor T23 is connected to the node BLBIAS. A second end of the transistor T23 is connected to the corresponding bit line BLb. A signal BIASb is supplied to the gate of the transistor T23.

Next, a connection relationship between elements in the latch circuits SDL, ADL and BDL will be described.

A first end of the transistor T30 is connected to the bus LBUS. A second end of the transistor T30 is connected to an output terminal of the inverter INV0 and an input terminal of the inverter INV1.

A first end of the transistor T31 is connected to the bus LBUS. A second end of the transistor T31 is connected to an input terminal of the inverter INV0 and an output terminal of the inverter INV1.

Signals STL and STI are input to the gate of the transistor T30 and the gate of the transistor T31 in the latch circuit SDL, respectively. Control signals ATL and ATI are input to the gate of the transistor T30 and the gate of the transistor T31 in the latch circuit ADL, respectively. Control signals BTL and BTI are input to the gate of the transistor T30 and the gate of the transistor T31 in the latch circuit BDL, respectively.

The input terminal and the output terminal of the inverter INV0 in the latch circuit SDL correspond to nodes SINV and SLAT, respectively. The input terminal and the output terminal of the inverter INV0 in the latch circuit ADL correspond to nodes AINV and ALAT, respectively. The input terminal and the output terminal of the inverter INV0 in the latch circuit BDL correspond to nodes BINV and BLAT, respectively.

The sense amplifier module 16 of the memory device 3 according to the first embodiment is not limited to the circuit configuration described above. For example, the number of latch circuits provided in each sense amplifier unit SAU may be appropriately changed based on the number of pages stored in one cell unit CU. Further, the sense amplifier module 16 may further include an arithmetic circuit configured to execute various arithmetic operations based on data stored in the latch circuits SDL, ADL, and BDL.

1.1.4 Structure of Memory Device

Next, an example of a structure of the memory device according to the first embodiment will be described.

1.1.4.1 Overall Structure of Memory Device

Figure 5:
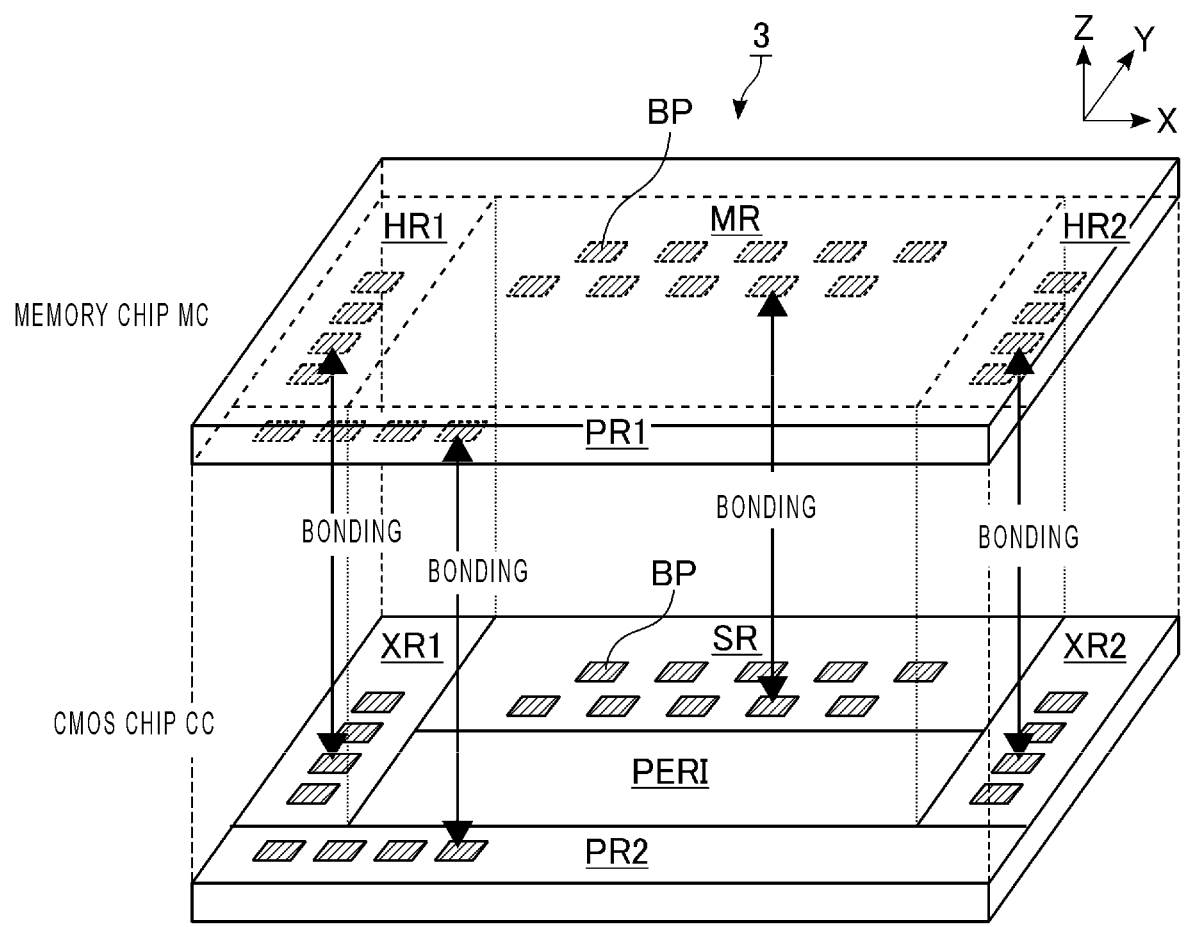
FIG. 5 is a perspective view illustrating an example of the overall structure of the memory device according to the first embodiment.

FIG. 5 is a perspective view illustrating an example of the overall structure of the memory device according to the first embodiment. As illustrated in FIG. 5, the memory device 3 includes a memory chip MC and a CMOS chip CC. The memory device 3 is formed by bonding the lower surface of the memory chip MC and the upper surface of the CMOS chip CC together. The memory chip MC includes a structure corresponding to the memory cell array 10. The CMOS chip CC includes, for example, a structure corresponding to the command register 11, the address register 12, the sequencer 13, the driver module 14, the row decoder module 15, and the sense amplifier module 16.

Hereinafter, the plane to which the CMOS chip CC and the memory chip MC are bonded is defined as the XY plane. The directions orthogonal to each other in the XY plane are defined as the X direction and the Y direction. Further, the direction from the CMOS chip CC to the memory chip MC is defined as the +Z direction. In contrast, the direction from the memory chip MC to the CMOS chip CC is defined as the −Z direction. The +Z direction and the −Z direction are also defined as the upward direction and the downward direction, respectively. In this way, when distinguishing between the positive (+) direction and the negative (−) direction, "+" or "−" may be added to the direction. The X direction, the Y direction, and the Z direction constitute a right-handed coordinate system.

The region of the memory chip MC is divided into, for example, a memory region MR, drawing regions HR1 and HR2, and a pad region PR1. The memory region MR is used for storing data and occupies most of the memory chip MC. A plurality of NAND strings NS are disposed in the memory region MR. For example, the drawing regions HR1 and HR2 sandwich the memory region MR in the X direction. The drawing regions HR1 and HR2 are used for connection between the memory chip MC and the row decoder module 15 in the CMOS chip CC. (i) the pad region PR1 and (ii) the memory region MR and the drawing regions HR1 and HR2 are arranged in the Y direction. For example, the input/output circuit of the memory device 3 is disposed in the pad region PR1.

Further, the memory chip MC has a plurality of bonding pads BP on bottom of each of the memory region MR, the drawing regions HR1 and HR2, and the pad region PR1. The bonding pad BP is also referred to as, for example, a bonding metal. The bonding pad BP in the memory region MR is connected to the corresponding bit line BL. The bonding pad BP in the drawing region HR is connected to a corresponding wiring among the word line WL and the select gate lines SGD and SGS. The bonding pad BP in the pad region PR1 is connected to a pad (not illustrated) provided on the memory chip MC. The pad provided on the memory chip MC is used for, for example, connection between the memory device 3 and the memory controller 2.

The region of the CMOS chip CC is divided into, for example, a sense amplifier region SR, a peripheral circuit region PERI, transfer regions XR1 and XR2, and a pad region PR2. The sense amplifier region SR and the peripheral circuit region PERI are arranged in the Y direction. The sense amplifier region SR and the peripheral circuit region PERI overlap with the memory region MR in the memory chip MC when viewed in the Z direction. The sense amplifier module 16 is disposed in the sense amplifier region SR. For example, the sequencer 13 is disposed in the peripheral circuit region PERI.

The transfer regions XR1 and XR2 sandwich a group of the sense amplifier region SR and the peripheral circuit region PERI in the X direction. The transfer regions XR1 and XR2 overlap with the drawing regions HR1 and HR2, respectively, when viewed in the Z direction. The row decoder module 15 is disposed in the transfer regions XR1 and XR2.

The pad region PR2 overlaps with the pad region PR1 when viewed in the Z direction. For example, the input/output circuit of the memory device 3 is disposed in the pad region PR2.

Further, the CMOS chip CC has the plurality of bonding pads BP on top of each of the sense amplifier region SR, the peripheral circuit region PERI, the transfer regions XR1 and XR2, and the pad region PR2. The plurality of boning pads BP in the sense amplifier region SR overlap with the plurality of bonding pads BP in the memory region MR, respectively, when viewed in the Z direction. The plurality of boning pads BP in the transfer region XR1 overlap with the plurality of bonding pads BP in the drawing region HR1, respectively, when viewed in the Z direction. The plurality of boning pads BP in the transfer region XR2 overlap with the plurality of bonding pads BP in the drawing region HR2, respectively, when viewed in the Z direction. The plurality of boning pads BP in the pad region PR1 overlap with the plurality of bonding pads BP in the pad region PR2, respectively, when viewed in the Z direction.

Two opposite bonding pads BP between the memory chip MC and the CMOS chip CC are bonded together ("bonding" in FIG. 5). Thus, the circuit in the memory chip MC and the circuit in the CMOS chip CC are electrically connected to each other. A group of two opposite bonding pads BP between the memory chip MC and the CMOS chip CC may have a boundary, or may be integrated.

The memory device 3 according to the first embodiment is not limited to the structure described above. For example, at least one drawing region HR adjacent to the memory region MR may be provided. The memory device 3 may include a plurality of groups of the memory region MR and the drawing region HR. In this case, a group of the sense amplifier region SR, the transfer region XR, and the peripheral circuit region PERI is appropriately provided corresponding to the arrangement of the memory region MR and the drawing region HR. The arrangement of the memory chip MC and the CMOS chip CC may be reversed. In this case, the bonding pad BP provided on the upper surface of the memory chip MC and the bonding pad BP provided on the lower surface of the CMOS chip CC are bonded together, and a pad used for connection with the outside is provided on the CMOS chip CC.

1.1.4.2 Planar Layout of Sense Amplifier Module

Figure 6:
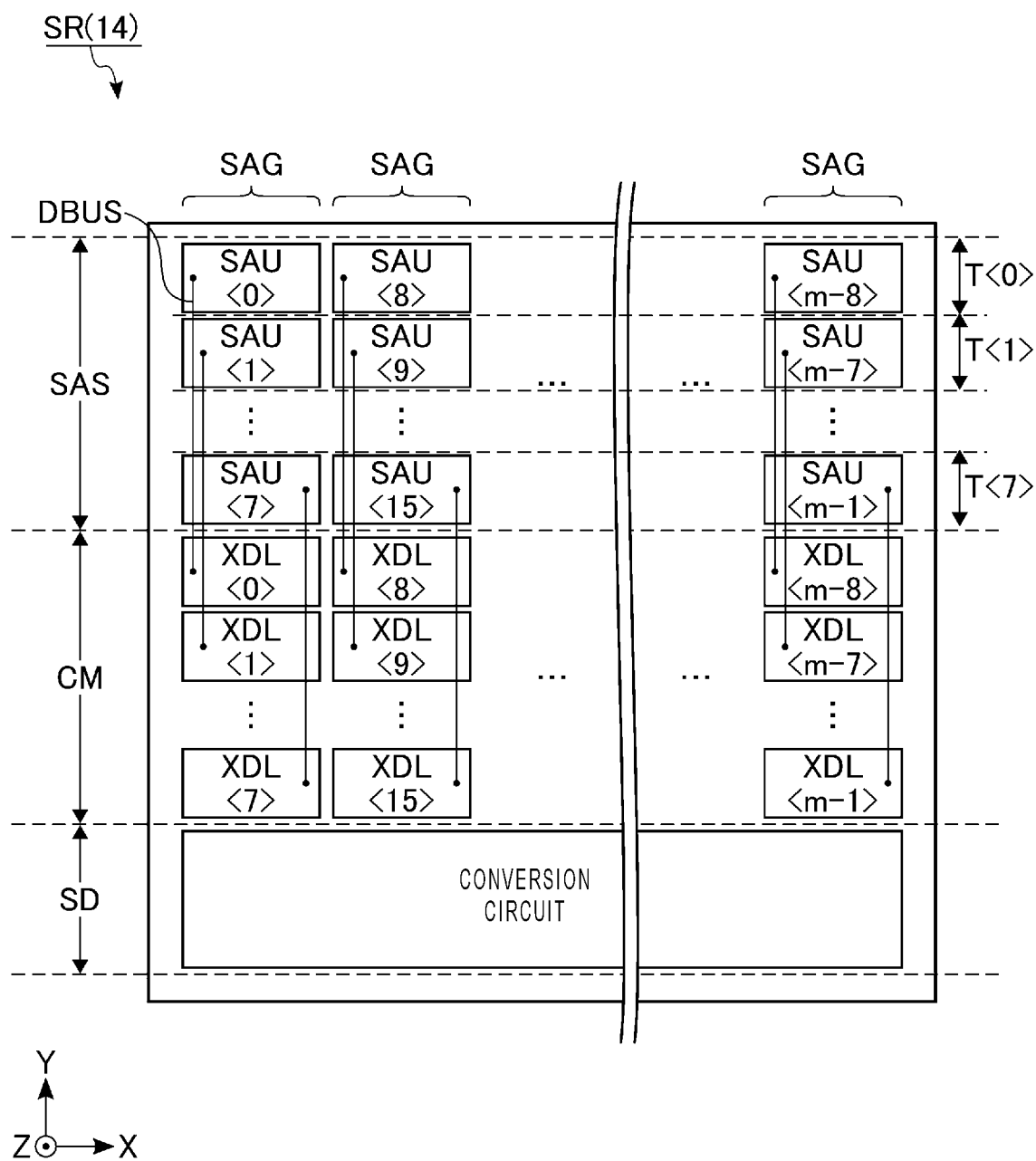
FIG. 6 is a plan view illustrating an example of a planar layout of the sense amplifier module of the memory device according to the first embodiment.

FIG. 6 is a plan view illustrating an example of a planar layout of the sense amplifier module of the memory device according to the first embodiment. FIG. 6 illustrates an example of a planar layout of the sense amplifier module 16 in the sense amplifier region SR of the CMOS chip CC. As illustrated in FIG. 6, in the sense amplifier region SR, the conversion circuit SD, the cache memory CM, and the sense amplifier set SAS are arranged in this order in the Y direction.

The Latch circuits XDL<0> to XDL<m−1> in the cache memory CM are connected to the conversion circuit SD via wirings (not shown).

For example, eight latch circuits XDL are arranged in the Y direction in the region of the cache memory CM. Then, a plurality of groups of the eight latch circuits XDL arranged in the Y direction are arranged in the X direction. Specifically, for example, the latch circuits XDL<0> to XDL<7> are arranged in the Y direction. The latch circuits XDL<8> to XDL<15> are arranged in the Y direction. The latch circuits XDL<8> to XDL<15> are disposed next to the latch circuits XDL<0> to XDL<7>, respectively, so as to be arranged along the X direction.

The plurality of latch circuits XDL<0> to XDL<m−1> are connected, respectively, to the plurality of sense amplifier units SAU<0> to SAU<m−1> via a plurality of buses DBUS each having a portion extending in the Y direction.

For example, eight sense amplifier units SAU are arranged in the Y direction in the region of the sense amplifier set SAS. Then, a plurality of groups of the eight sense amplifier units SAU arranged in the Y direction are arranged in the X direction. Specifically, for example, the sense amplifier units SAU<0> to SAU<7> are arranged in the Y direction. The sense amplifier units SAU<8> to SAU<15> are arranged in the Y direction. The sense amplifier units SAU<8> to SAU<15> are arranged next to the sense amplifier units SAU<0> to SAU<7>, respectively along the X direction. Hereinafter, a group of the eight sense amplifier units SAU arranged in the Y direction is referred to as a sense amplifier group SAG.

Further, hereinafter, a group of a plurality of sense amplifier units SAU arranged in the X direction is referred to as a tier T. More specifically, a group of a plurality of sense amplifier units SAU<0>, SAU<8>, . . . , and SAU<m−8> is referred to as a tier T<0>. A group of a plurality of sense amplifier units SAU<1>, SAU<9>, . . . , and SAU<m−7> is referred to as a tier T<1>. Similarly, a group of a plurality of sense amplifier units SAU<2>, SAU<10>, . . . and SAU<m−6> to a group of a plurality of sense amplifier units SAU<6>, SAU<14>, . . . , and SAU<m−2> are referred to as tiers T<2> to T<6>, respectively. Then, a group of a plurality of sense amplifier units SAU<7>, SAU<15>, . . . , and SAU<m−1> is referred to as a tier T<7>.

The number of sense amplifier units SAU provided in one sense amplifier group SAG is designed based on the pitch of bit lines BL. For example, when the width of the sense amplifier group SAG in the Y direction is designed to match the pitch of eight bit lines BL, the sense amplifier group SAG is implemented by eight sense amplifier units SAU.

Figure 7:
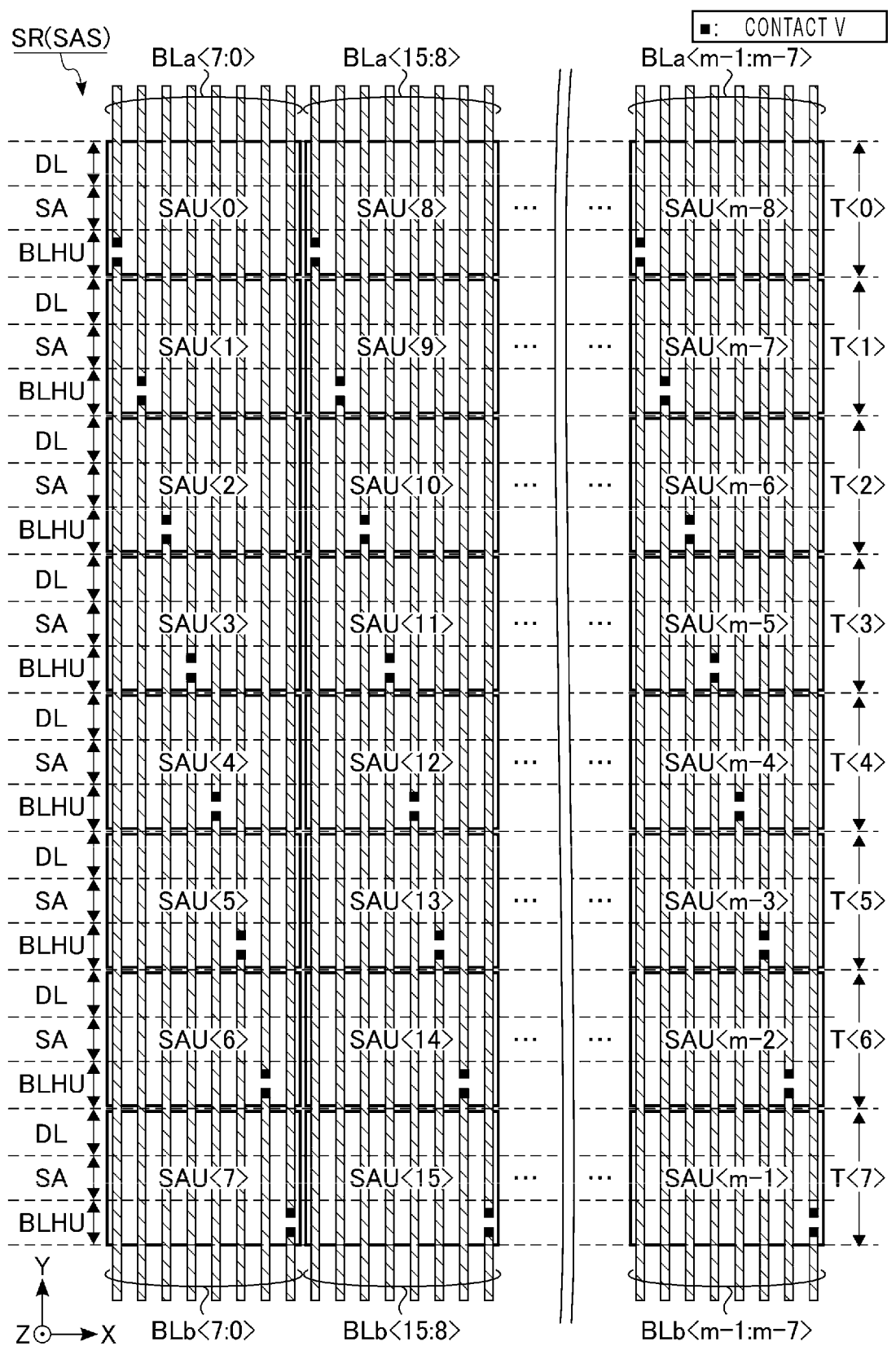
FIG. 7 is a plan view illustrating an example of a planar layout of the sense amplifier units of the sense amplifier module and bit lines of the memory device according to the first embodiment.

FIG. 7 is a plan view illustrating an example of a planar layout of the sense amplifier units of the sense amplifier module and bit lines of the memory device according to the first embodiment. In the example of FIG. 7, a positional relationship between a portion of the sense amplifier region SR in which the sense amplifier set SAS is disposed and the bit lines BL is illustrated.

As illustrated in FIG. 7, the bit line connector BLHU, the sense amplifier SA, and the plurality of latch circuits SDL, ADL, and BDL ("DL" in FIG. 7) of each of all the sense amplifier units SAU are arranged in this order in the Y direction. One sense amplifier unit SAU is associated with a group of the bit lines BLa and BLb.

A plurality of bit lines BLa<0> to BLa<m−1> are arranged in the X direction. A plurality of bit lines BLb<0> to BLb<m−1> are arranged in the X direction. The plurality of bit lines BLa<0> to BLa<m−1> are arranged in the Y direction with the plurality of bit lines BLb<0> to BLb<m−1>, respectively. Then, eight groups of the bit lines BLa and BLb arranged adjacent to each other in the X direction overlap with one sense amplifier group SAG when viewed in the Z direction.

Specifically, each of ends of the bit lines BLa<0> and BLb<0> adjacent to each other in the Y direction is provided at a position overlapping with the bit line connector BLHU of the sense amplifier unit SAU<0> when viewed in the Z direction. Each of the ends of the bit lines BLa<0> and BLb<0> adjacent to each other in the Y direction is connected to the bit line connector BLHU of the sense amplifier unit SAU<0> via a contact V extending in the Z direction.

Each of ends of the bit lines BLa<1> and BLb<1> adjacent to each other in the Y direction is provided at a position overlapping with the bit line connector BLHU of the sense amplifier unit SAU<1> when viewed in the Z direction. Each of the ends of the bit lines BLa<1> and BLb<1> adjacent to each other in the Y direction is connected to the bit line connector BLHU of the sense amplifier unit SAU<1> via the contact V.

Each of ends of the bit lines BLa<2> and BLb<2> adjacent to each other in the Y direction is provided at a position overlapping with the bit line connector BLHU of the sense amplifier unit SAU<2> when viewed in the Z direction. Each of the ends of the bit lines BLa<2> and BLb<2> adjacent to each other in the Y direction is connected to the bit line connector BLHU of the sense amplifier unit SAU<2> via the contact V.

Each of ends of the bit lines BLa<3> and BLb<3> adjacent to each other in the Y direction is provided at a position overlapping with the bit line connector BLHU of the sense amplifier unit SAU<3> when viewed in the Z direction. Each of the ends of the bit lines BLa<3> and BLb<3> adjacent to each other in the Y direction is connected to the bit line connector BLHU of the sense amplifier unit SAU<3> via the contact V.

Each of ends of the bit lines BLa<4> and BLb<4> adjacent to each other in the Y direction is provided at a position overlapping with the bit line connector BLHU of the sense amplifier unit SAU<4> when viewed in the Z direction. Each of the ends of the bit lines BLa<4> and BLb<4> adjacent to each other in the Y direction is connected to the bit line connector BLHU of the sense amplifier unit SAU<4> via the contact V.

Each of ends of the bit lines BLa<5> and BLb<5> adjacent to each other in the Y direction is provided at a position overlapping with the bit line connector BLHU of the sense amplifier unit SAU<5> when viewed in the Z direction. Each of the ends of the bit lines BLa<5> and BLb<5> adjacent to each other in the Y direction is connected to the bit line connector BLHU of the sense amplifier unit SAU<5> via the contact V.

Each of ends of the bit lines BLa<6> and BLb<6> adjacent to each other in the Y direction is provided at a position overlapping with the bit line connector BLHU of the sense amplifier unit SAU<6> when viewed in the Z direction. Each of the ends of the bit lines BLa<6> and BLb<6> adjacent to each other in the Y direction is connected to the bit line connector BLHU of the sense amplifier unit SAU<6> via the contact V.

Each of ends of the bit lines BLa<7> and BLb<7> adjacent to each other in the Y direction is provided at a position overlapping with the bit line connector BLHU of the sense amplifier unit SAU<7> when viewed in the Z direction. Each of the ends of the bit lines BLa<7> and BLb<7> adjacent to each other in the Y direction is connected to the bit line connector BLHU of the sense amplifier unit SAU<7> via the contact V.

A positional relationship between the eight groups of the bit lines BLa and BLb and the sense amplifier group SAG as described above is repeated in the X direction over the sense amplifier region SR.

1.1.4.3 Planar Layout of Memory Cell Array

Figure 8:
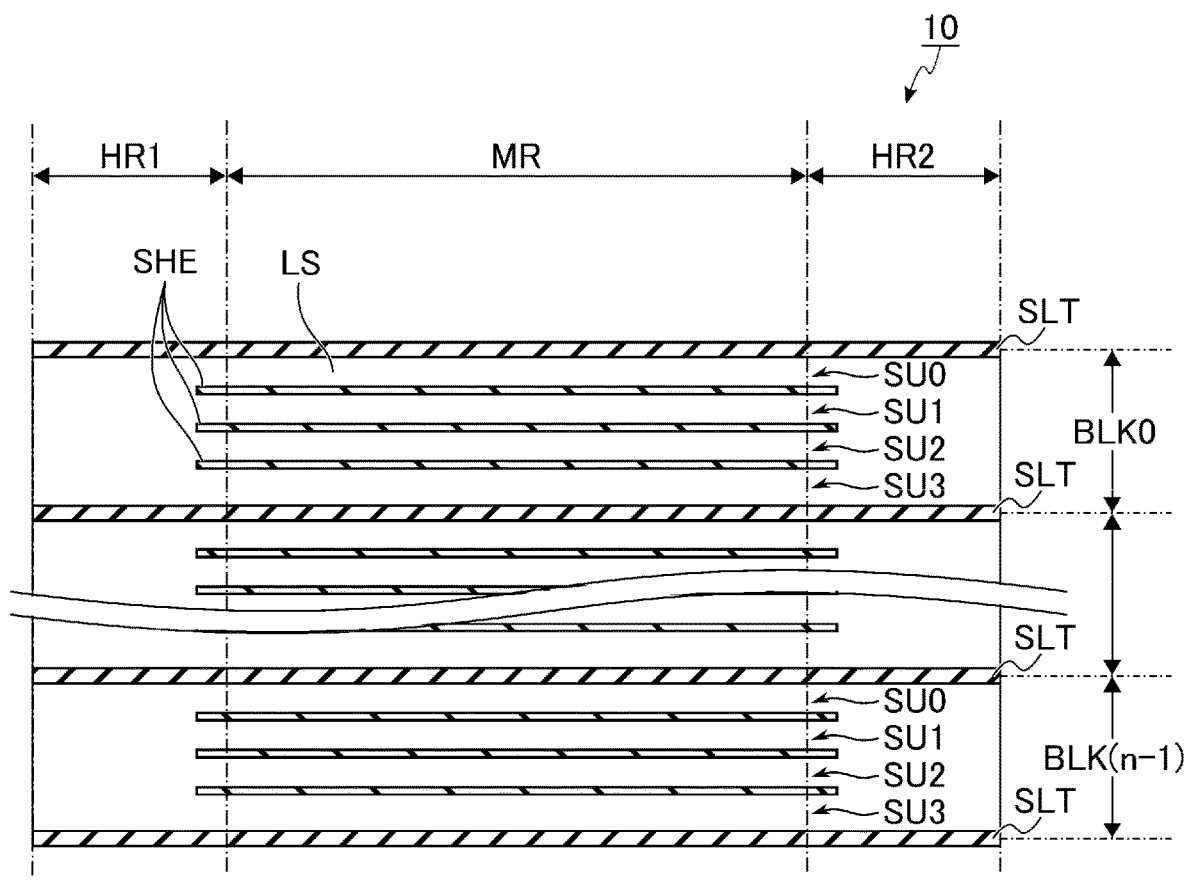
FIG. 8 is a plan view illustrating an example of a planar layout of the memory cell array of the memory device according to the first embodiment.

FIG. 8 is a plan view illustrating an example of a planar layout of the memory cell array of the memory device according to the first embodiment. In FIG. 8, an example of a planar layout of the memory cell array 10 in the memory region MR and the drawing regions HR1 and HR2 of the memory chip MC is illustrated.

As illustrated in FIG. 8, the memory cell array 10 includes a stacked wiring structure LS and a plurality of members SLT and SHE.

The stacked wiring structure LS has a structure in which a plurality of wiring layers (not illustrated) each corresponding to any one of the word line WL and the select gate lines SGD and SGS are stacked in the Z direction with an insulator layer interposed therebetween. The stacked wiring structure LS is provided over the memory region MR and the drawing regions HR1 and HR2. A plurality of memory pillars (not illustrated) each having a structure corresponding to the NAND string NS are provided in the memory region MR within the stacked wiring structure LS. Details of the stacked wiring structure LS will be described later.

The plurality of members SLT are, for example, plate-shaped insulators spreading out in the XZ plane. The plurality of members SLT are arranged in the Y direction. Each of the plurality of members SLT extends in the X direction across the memory region MA and the drawing regions HR1 and HR2 in the boundary region between adjacent blocks BLK. Then, each of the plurality of members SLT divides the stacked wiring structure LS into two portions arranged in the Y direction.

The plurality of members SHE are, for example, plate-shaped insulators spreading out in the XZ plane. The plurality of members SHE are arranged in the Y direction. In the example of FIG. 8, four members SHE are disposed between the respective adjacent members SLT. Each of the plurality of members SHE extends in the X direction across the memory region MA. Both ends of each of the plurality of members SHE are located in the drawing regions HR1 and HR2, respectively. Then, each of the plurality of members SHE divides the wiring layer of the stacked wiring structure LS corresponding to the select gate line SGD into two portions arranged in the Y direction.

In the planar layout of the memory cell array 10 described above, each region partitioned by the members SLT corresponds to one block BLK. Further, each region partitioned by the members SLT and SHE corresponds to one string unit SU. Then, the above-described layout is repeatedly disposed in the Y direction from the block BLK0 to the block BLK(n−1) in the memory region MR and the drawing regions HR1 and HR2.

Figure 9:
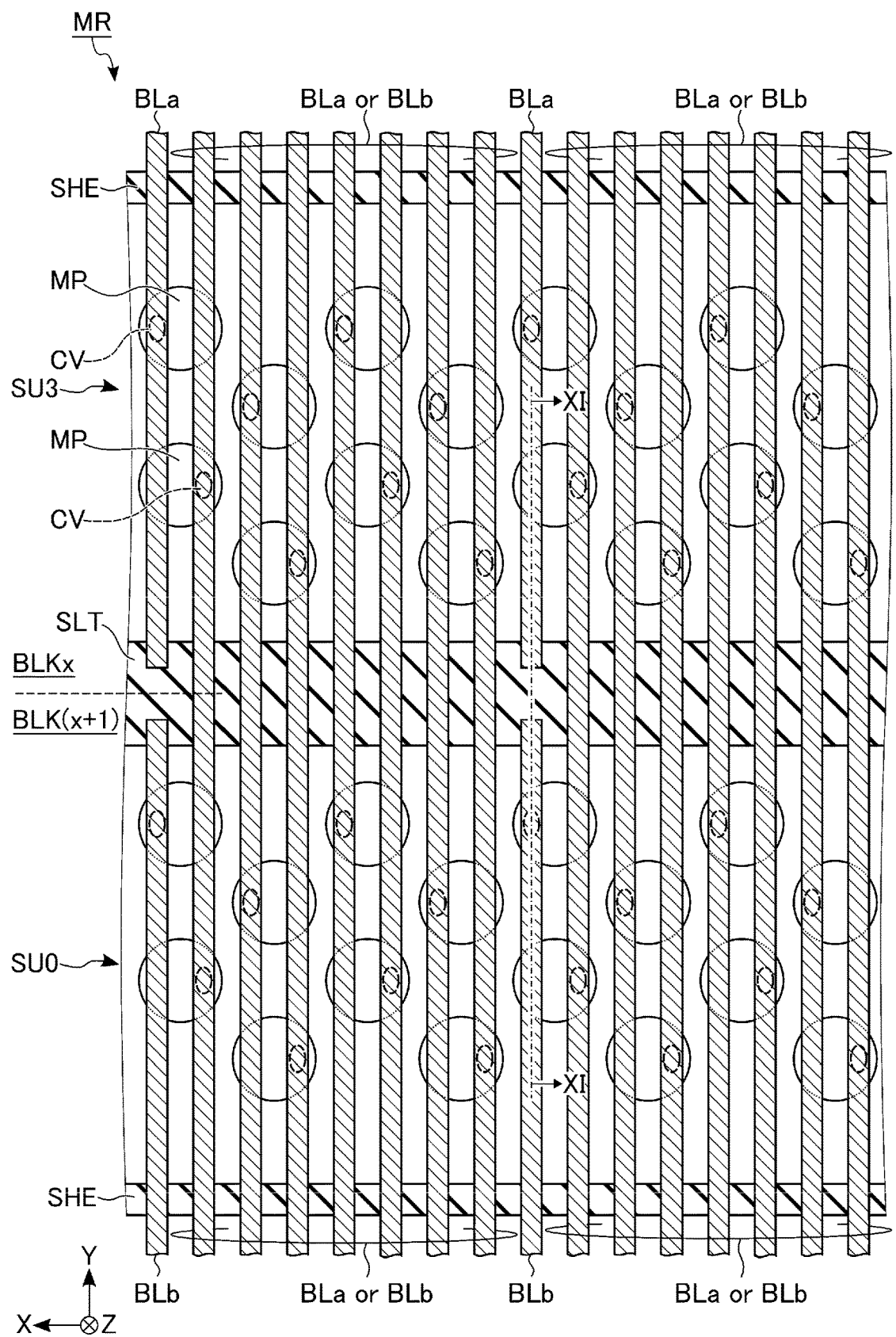
FIG. 9 is a plan view illustrating an example of a planar layout of blocks and bit lines of the memory cell array of the memory device according to the first embodiment.

FIG. 9 is a plan view illustrating an example of a planar layout of blocks and bit lines of the memory cell array of the memory device according to the first embodiment. In the example of FIG. 9, a positional relationship between a boundary portion of two blocks BLKx and BLK(x+1) and the bit lines BL in the memory region MR is illustrated (0≤x≤n−2). As illustrated in FIG. 9, the memory cell array 10 further includes a plurality of memory pillars MP and a plurality of contacts CV.

Each of the plurality of memory pillars MP functions as, for example, one NAND string NS. The plurality of memory pillars MP are disposed in, for example, a staggered shape of four rows in a region between the member SLT and the member SHE adjacent to each other. Each of the plurality of memory pillars MP is electrically connected to a corresponding one bit line BLa or BLb via the contact CV.

One memory pillar MP overlaps with any one of the bit lines BLa and BLb in a group when viewed in the Z direction. The example of FIG. 9 illustrates a case where any one of the bit lines BLa and BLb in each of two groups arranged in the X direction overlaps with one memory pillar MP when viewed in the Z direction.

Each of opposite ends of a group of the bit lines BLa and BLb overlaps with a position at which the member SLT is provided when viewed in the Z direction. In the example of FIG. 9, a case where each of opposite ends of the bit lines BLa and BLb in each group of the first and ninth columns in the X direction overlaps with the member STL located at the boundary of the block BLKx and the block BLK(x+1) when viewed in the Z direction is illustrated. In this case, in the first and ninth columns in the X direction, the memory pillar MP of the block BLKx is connected to the bit line BLa, and the memory pillar MP of the block BLK(x+1) is connected to the bit line BLb.

As described with reference to FIG. 7, a plurality of groups of the bit lines BLa and BLb arranged at the interval of eight bit lines BL in the X direction (e.g., the bit lines BLa<0> and BLb<0>, BLa<8> and BLb<8>, . . . ) have ends at the same positions along the Y direction. Therefore, a group of the bit lines BLa and BLb having opposite ends at positions overlapping with the same member SLT when viewed in the Z direction appears for every eight bit lines BL along the X direction.

FIG. 10 is a diagram illustrating an example of a connection relationship between the sense amplifier units, blocks, and bit lines of the memory device according to the first embodiment. In FIG. 10, a pattern of the bit lines BL connected to the block BLK depending on a positional relationship between that block BLK and the tier T is illustrated.

As illustrated in FIG. 10, the block BLK located on the +Y direction side of the tier T<0> and the block BLK located at a position overlapping with the tier T<0> when viewed in the Z direction are connected to the sense amplifier units SAU provided in all the tiers T<0> to T<7> via the bit lines BLa.

The block BLK located at a position overlapping with the tier T<1> when viewed in the Z direction is connected to the sense amplifier unit SAU provided in the tier T<0> via the bit line BLb. The block BLK located at the position overlapping with the tier T<1> when viewed in the Z direction is connected to the sense amplifier units SAU provided in the tiers T<1> to T<7> via the bit lines BLa.

The block BLK located at a position overlapping with the tier T<2> when viewed in the Z direction is connected to the sense amplifier units SAU provided in the tiers T<0> and T<1> via the bit lines BLb. The block BLK located at the position overlapping with the tier T<2> when viewed in the Z direction is connected to the sense amplifier units SAU provided in the tiers T<2> to T<7> via the bit lines BLa.

The block BLK located at a position overlapping with the tier T<3> when viewed in the Z direction is connected to the sense amplifier units SAU provided in the tiers T<0> to T<2> via the bit lines BLb. The block BLK located at the position overlapping with the tier T<3> when viewed in the Z direction is connected to the sense amplifier units SAU provided in the tiers T<3> to T<7> via the bit lines BLa.

The block BLK located at a position overlapping with the tier T<4> when viewed in the Z direction is connected to the sense amplifier units SAU provided in the tiers T<0> to T<3> via the bit lines BLb. The block BLK located at the position overlapping with the tier T<4> when viewed in the Z direction is connected to the sense amplifier units SAU provided in the tiers T<4> to T<7> via the bit lines BLa.

The block BLK located at a position overlapping with the tier T<5> when viewed in the Z direction is connected to the sense amplifier units SAU provided in the tiers T<0> to T<4> via the bit lines BLb. The block BLK located at the position overlapping with the tier T<5> when viewed in the Z direction is connected to the sense amplifier units SAU provided in the tiers T<5> to T<7> via the bit lines BLa.

The block BLK located at a position overlapping with the tier T<6> when viewed in the Z direction is connected to the sense amplifier units SAU provided in the tiers T<0> to T<5> via the bit lines BLb. The block BLK located at the position overlapping with the tier T<6> when viewed in the Z direction is connected to the sense amplifier units SAU provided in the tiers T<6> and T<7> via the bit lines BLa.

The block BLK located at a position overlapping with the tier T<7> when viewed in the Z direction is connected to the sense amplifier units SAU provided in the tiers T<0> to T<6> via the bit lines BLb. The block BLK located at the position overlapping with the tier T<7> when viewed in the Z direction is connected to the sense amplifier unit SAU provided in the tier T<7> via the bit line BLa.

The block BLK located on the −Y direction side of the tier T<7> when viewed in the Z direction is connected to the sense amplifier units SAU provided in all the tiers T<0> to T<7> via the bit lines BLb.

1.1.4.4 Cross-Sectional Structure of Memory Device

Figure 11:
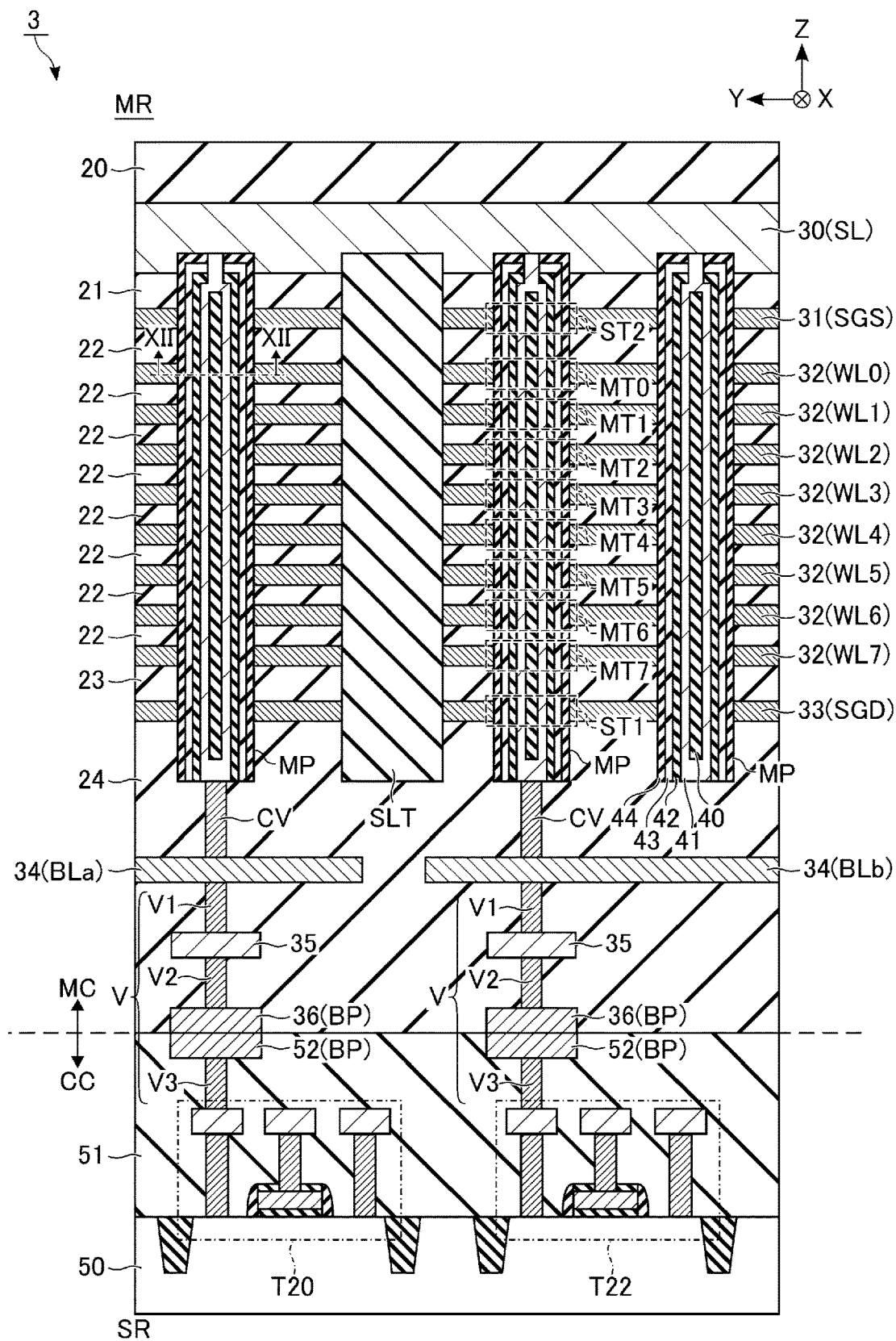
FIG. 11 is a cross-sectional view taken along line XI-XI of FIG. 9, illustrating an example of a cross-sectional structure of the memory device according to the first embodiment.

FIG. 11 is a cross-sectional view taken along line XI-XI of FIG. 9, illustrating an example of a cross-sectional structure of the memory device according to the first embodiment. In FIG. 11, a configuration in which the memory chip MC and the CMOS chip CC are bonded together is illustrated. Further, in FIG. 11, a cross-sectional structure corresponding to the sense amplifier region SR is illustrated, in addition to the cross-sectional structure corresponding to the memory region MR illustrated in FIG. 9.

First, a configuration on the memory chip MC side will be described. The configuration on the memory chip MC side will be described from an upper configuration toward a lower configuration for convenience of description.

A conductor layer 30 is provided below an insulator layer 20. The conductor layer 30 is formed, for example, in a shape of a plate spreading out along the XY plane. The conductor layer 30 is used as the source line SL. The conductor layer 30 contains, for example, polysilicon. The insulator layer 20 contains, for example, an insulator such as silicon oxide.

A conductor layer 31 is provided below the conductor layer 30 with an insulator layer 21 interposed therebetween. The conductor layer 31 is formed, for example, in a shape of a plate spreading out along the XY plane. The conductor layer 31 is used as the select gate line SGS. The conductor layer 31 contains, for example, tungsten. The insulator layer 21 contains, for example, an insulator such as silicon oxide.

An insulator layer 22 and a conductor layer 32 are alternately stacked downward in this order below the conductor layer 31. The conductor layer 32 is formed, for example, in a shape of a plate spreading out along the XY plane. A plurality of conductor layers 32 are used as the word lines WL0 to WL7, respectively, in order from the insulator layer 20 side. The conductor layer 32 contains, for example, tungsten. The insulator layer 22 contains, for example, an insulator such as silicon oxide.

A conductor layer 33 is provided below the lowermost conductor layer 32 with an insulator layer 23 interposed therebetween. The conductor layer 33 is formed, for example, in a shape of a plate spreading out along the XY plane. The conductor layer 33 is used as the select gate line SGD. The conductor layer 33 contains, for example, tungsten. The insulator layer 23 contains, for example, an insulator such as silicon oxide.

A conductor layer 34 is provided below the conductor layer 33 with an insulator layer 24 interposed therebetween. The insulator layer 24 also covers the underside of the conductor layer 34. The conductor layer 34 is formed, for example, in a shape of a line extending in the Y direction and is used as the bit lines BLa and BLb. That is, a plurality of conductor layers 34 are arranged along the X direction in a region (not illustrated). The conductor layer 34 contains, for example, copper. The insulator layer 24 contains, for example, an insulator such as silicon oxide.

The insulator layers 21 to 23 and the conductor layers 31 to 33 correspond to the stacked wiring structure LS in FIG. 8. The member SLT has, for example, a portion provided along the XZ plane and divides the stacked wiring structure LS, i.e., the insulator layers 21 to 23 and the conductor layers 31 to 33.

The memory pillar MP extends in the Z direction so as to penetrate the conductor layers 31 to 33. The upper end of the memory pillar MP is in contact with the conductor layer 30. The lower end of the memory pillar MP is located between the conductor layer 33 and the conductor layer 34.

A portion in which the memory pillar MP and the conductor layer 31 intersect each other functions as the select transistor ST2. A portion in which the memory pillar MP and one conductor layer 32 intersect each other functions as one memory cell transistor MT. A portion in which the memory pillar MP and the conductor layer 33 intersect each other functions as the select transistor ST1.

Further, the memory pillar MP includes a core film 40, a semiconductor film 41, a tunnel insulating film 42, a charge storage film 43, and a block insulating film 44. The core film 40 extends along the Z direction. For example, the upper end of the core film 40 is provided in a layer above the conductor layer 31, and the lower end of the core film 40 is located between the conductor layer 33 and the conductor layer 34. The semiconductor film 41 covers the periphery of the core film 40. A part of the semiconductor film 41 is in contact with the conductor layer 30 above the memory pillar MP. The tunnel insulating film 42, the charge storage film 43, and the block insulating film 44 form a stacked film. The stacked film covers the side surface and the bottom surface of the semiconductor film 41 except for a portion of the semiconductor film 41 in contact with the conductor layer 30. The core film 40 contains, for example, an insulator such as silicon oxide. The semiconductor film 41 contains, for example, silicon.

Figure 12:
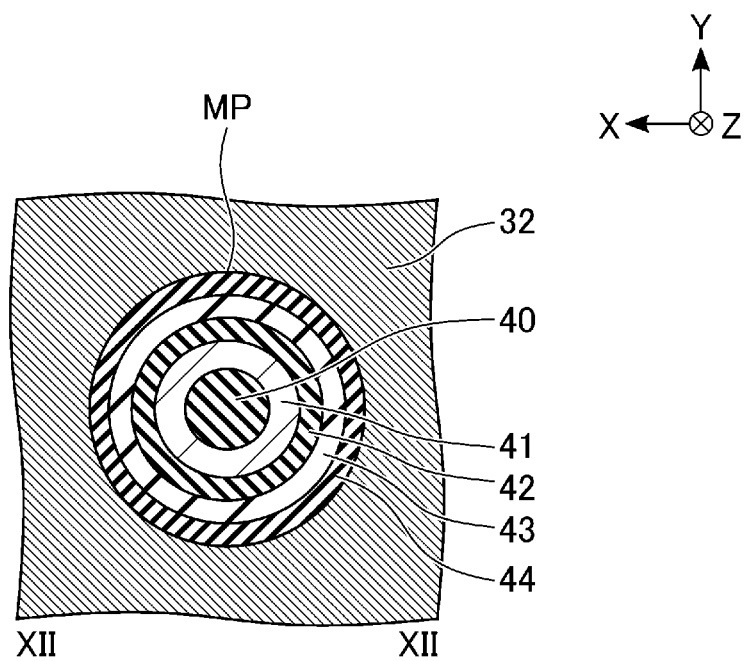
FIG. 12 is a cross-sectional view taken along line XII-XII of FIG. 11, illustrating an example of a cross-sectional structure of a memory cell transistor of the memory device according to the first embodiment.

FIG. 12 is a cross-sectional view taken along line XII-XII of FIG. 11, illustrating an example of a cross-sectional structure of a memory cell transistor of the memory device according to the first embodiment. More specifically, FIG. 12 illustrates a cross-sectional structure of the memory pillar MP in a layer including the conductor layer 32.

In the cross section including the conductor layer 32, the core film 40 is provided in, for example, a central portion of the memory pillar MP. The semiconductor film 41 surrounds the side surface of the core film 40. The tunnel insulating film 42 surrounds the side surface of the semiconductor film 41. The charge storage film 43 surrounds the side surface of the tunnel insulating film 42. The block insulating film 44 surrounds the side surface of the charge storage film 43. The conductor layer 32 surrounds the side surface of the block insulating film 44.

Referring again to FIG. 11, the configuration on the memory chip MC side will be described.

A columnar contact CV is provided on the lower surface of the semiconductor film 41 in the memory pillar MP. In the illustrated region, one contact CV corresponding respectively to one memory pillar MP is indicated in each cross-sectional region partitioned by the member SLT. The memory pillar MP to which the contact CV is not connected among the illustrated memory pillars MP is connected to a corresponding contact CV in a region (not illustrated).

One conductor layer 34, i.e., one bit line BL is in contact with the lower surface of the contact CV. In the example of FIG. 11, the bit line BLa is connected to the contact CV on the +Y direction side from the member SLT. Further, the bit line BLb is connected to the contact CV on the −Y direction side from the member SLT. Each of opposite ends of the bit lines BLa and BLb is located below the member SLT.

A columnar contact V1 is provided on the lower surface of the conductor layer 34. A conductive layer 35 is in contact with the lower surface of the contact V1. A columnar contact V2 is provided on the lower surface of the conductor layer 35. The contacts V1 and V2 are a part of the contact V illustrated in FIG. 7. A conductor layer 36 is in contact with the lower surface of the contact V2. The conductor layer 36 is used as the bonding pad BP on the memory chip MC side. The lower surface of the conductor layer 36 is aligned with, for example, the lower surface of the insulator layer 24.

Next, a configuration on the CMOS chip CC side will be described. The configuration on the CMOS chip CC side will be described from a lower configuration toward an upper configuration.

The CMOS chip CC includes various elements including, for example, a semiconductor substrate 50, an insulator layer 51, a conductor layer 52, a contact V3, and the transistors T20 and T22.

The semiconductor substrate 50 is, for example, polysilicon containing P-type impurities. The insulator layer 51 is provided on the upper surface of the semiconductor substrate 50. The semiconductor substrate 50 includes a plurality of well regions (not illustrated). For example, various elements in the sense amplifier module 16 including the transistors T20 and T22 are formed in the plurality of well regions. Then, the plurality of well regions are separated from each other by, for example, shallow trench isolation (STI).

Columnar contacts V3 are provided respectively on the upper surface of the second end of the transistor T20 and the upper surface of the second end of the transistor T22. The contact V3 is a part of the contact V illustrated in FIG. 7. The conductor layer 52 is in contact with the upper surface of each contact V3. The conductor layer 52 is used as the bonding pad BP on the CMOS chip CC side. The upper surface of the conductor layer 52 is aligned with, for example, the upper surface of the insulator layer 51. Further, the upper surface of the conductor layer 52 is in contact with the lower surface of the corresponding conductor layer 36.

With the above configuration, the bit lines BLa and BLb in the memory chip MC are electrically connected, respectively, to the transistors T20 and T22 in the corresponding sense amplifier unit SAU in the CMOS chip CC via the contacts V3 extending in the Z direction.

1.2 Operation

Next, an operation of the memory device according to the first embodiment will be described.

As described in FIG. 10, when any one block BLK is selected, which NAND string NS is connected to the sense amplifier unit SAU via any one of the bit lines BLa or BLb is determined according to the tier T corresponding to that block BLK. Hereinafter, for each of a case of a read operation and a write operation and a case of an erase operation, a control operation of the bit line connector BLHU in each of a case where the NAND string NS and the sense amplifier unit SAU are connected via the bit line BLa and a case where the NAND string NS and the sense amplifier unit SAU are connected via bit line BLb will be described.

1.2.1 Read Operation and Write Operation

First, a control operation of the bit line connector BLHU in a read operation and a write operation will be described.

1.2.1.1 In Case of Using Bit Line BLa

Figure 13:
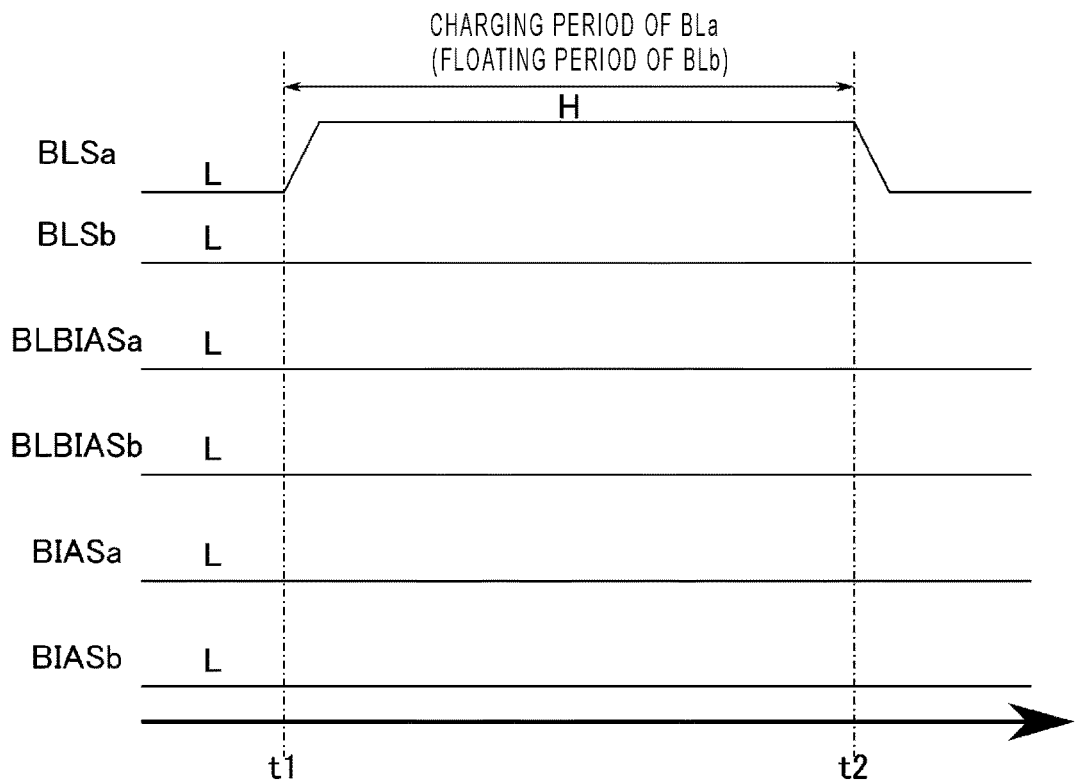
FIG. 13 is a timing chart illustrating a read operation and a write operation in a case of using a bit line BLa of the memory device according to the first embodiment.

FIG. 13 is a timing chart illustrating a read operation and a write operation in a case of using the bit line BLa of the memory device according to the first embodiment.

As illustrated in FIG. 13, when the NAND string NS and the sense amplifier unit SAU are connected via the bit line BLa, a signal BLSa of the "H" level is supplied to the gate of the transistor T20 of the bit line connector BLHU in a period from the time t1 to the time t2. A signal BIASa of the "L" level is supplied to the gate of the transistor T21. Thus, the transistors T20 and T21 are turned on and off, respectively. Therefore, the bit line BLa is electrically connected to the sense amplifier SA via the transistor T20.

Meanwhile, a signal BLSb of the "L" level is supplied to the gate of the transistor T22. A signal BIASb of the "L" level is supplied to the gate of the transistor T23. Thus, both the transistors T22 and T23 are turned off. Therefore, the bit line BLb is in the floating state.

By operating as described above, the bit line connector BLHU may electrically connect the NAND string NS and the sense amplifier SA via the bit line BLa in the period from the time t1 to the time t2.

1.2.1.2 In Case of Using Bit Line BLb

Figure 14:
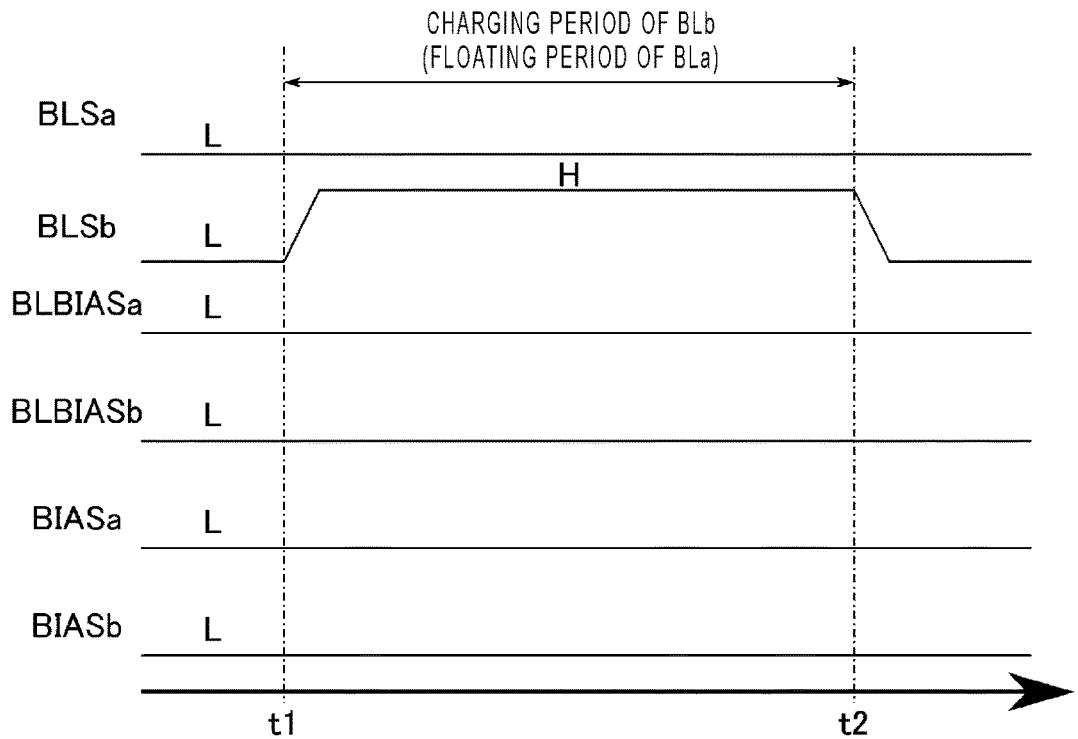
FIG. 14 is a timing chart illustrating a read operation and a write operation in a case of using a bit line BLb of the memory device according to the first embodiment.

FIG. 14 is a timing chart illustrating a read operation and a write operation in a case of using the bit line BLb of the memory device according to the first embodiment. The case of using the bit line BLa illustrated in FIG. 13 and the case of using the bit line BLb illustrated in FIG. 14 may occur simultaneously in a common read operation and write operation.

As illustrated in FIG. 14, when the NAND string NS and the sense amplifier unit SAU are connected via the bit line BLb, a signal BLSa of the "L" level is supplied to the gate of the transistor T20 of the bit line connector BLHU in a period from the time t1 to the time t2. A signal BIASa of the "L" level is supplied to the gate of the transistor T21. Thus, both the transistors T20 and T21 are turned off. Therefore, the bit line BLa is in the floating state.

Meanwhile, a signal BLSb of the "H" level is supplied to the gate of the transistor T22. A signal BIASb of the "L" level is supplied to the gate of the transistor T23. Thus, the transistors T22 and T23 are turned on and off, respectively.

Therefore, the bit line BLb is electrically connected to the sense amplifier SA via the transistor T22.

By operating as described above, the bit line connector BLHU may electrically connect the NAND string NS and the sense amplifier SA via the bit line BLb in the period from the time t1 to the time t2.

1.2.2 Erase Operation

Next, a control operation of the bit line connector BLHU in an erase operation will be described.

1.2.2.1 In Case of Using Bit Line BLa

Figure 15:
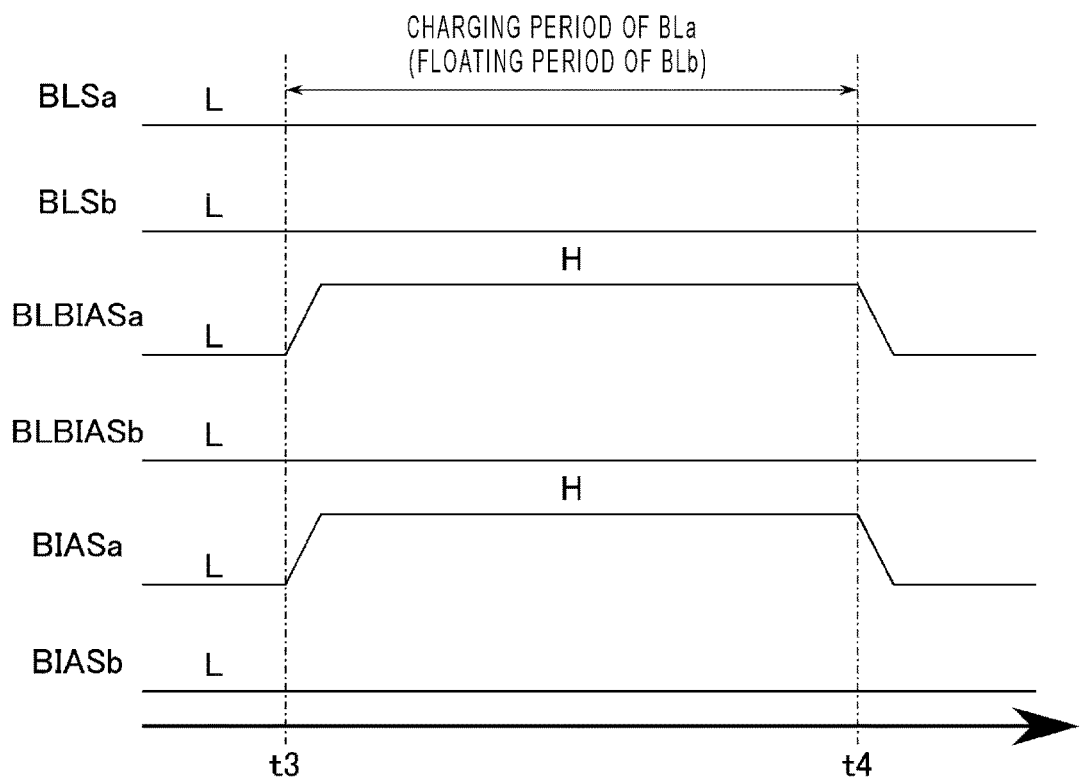
FIG. 15 is a timing chart illustrating an erase operation in a case of using a bit line BLa of the memory device according to the first embodiment.

FIG. 15 is a timing chart illustrating an erase operation in a case of using the bit line BLa of the memory device according to the first embodiment.

As illustrated in FIG. 15, when the NAND string NS and the sense amplifier unit SAU are connected via the bit line BLa, a signal BLSa of the "L" level is supplied to the gate of the transistor T20 of the bit line connector BLHU in a period from the time t3 to the time t4. A signal BIASa of the "H" level is supplied to the gate of the transistor T21. Thus, the transistors T20 and T21 are turned off and on, respectively. Further, a voltage VERA is supplied to the node BLBIAS. The voltage VERA is a high voltage for drawing electric charges from the charge storage film 43 of the memory cell transistor MT. Therefore, the bit line BLa is charged to the voltage VERA via the transistor T21.

Meanwhile, a signal BLSb of the "L" level is supplied to the gate of the transistor T22. A signal BIASb of the "L" level is supplied to the gate of the transistor T23. Thus, both the transistors T22 and T23 are turned off. Therefore, the bit line BLb is in the floating state.

By operating as described above, the bit line connector BLHU may charge a channel of the NAND string NS to the voltage VERA via the bit line BLa in the period from the time t3 to the time t4.

1.2.2.2 In case of Using Bit Line BLb

Figure 16:
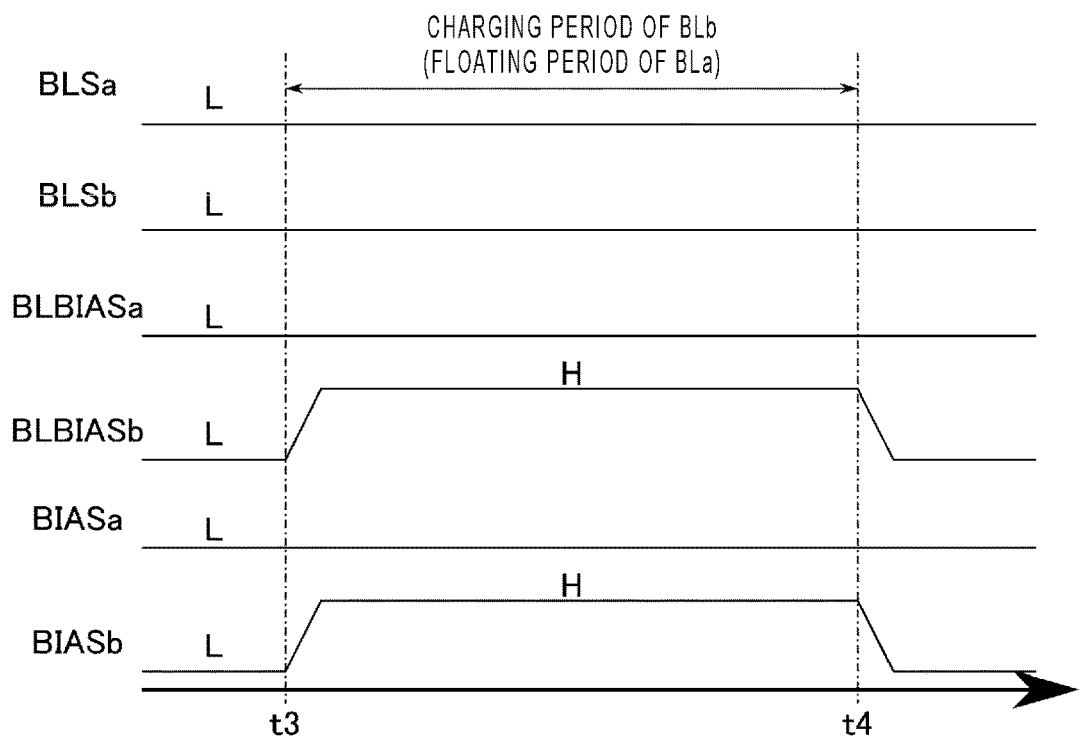
FIG. 16 is a timing chart illustrating an erase operation in a case of using a bit line BLb of the memory device according to the first embodiment.

FIG. 16 is a timing chart illustrating an erase operation in a case of using the bit line BLb of the memory device according to the first embodiment. The case of using the bit line BLa illustrated in FIG. 15 and the case of using the bit line BLb illustrated in FIG. 16 may occur simultaneously in a common erase operation.

As illustrated in FIG. 16, when the NAND string NS and the sense amplifier unit SAU are connected via the bit line BLb, a signal BLSa of the "L" level is supplied to the gate of the transistor T20 of the bit line connector BLHU in a period from the time t3 to the time t4. A signal BIASa of the "L" level is supplied to the gate of the transistor T21. Thus, both the transistors T20 and T21 are turned off. Therefore, the bit line BLa is in the floating state.

Meanwhile, a signal BLSb of the "L" level is supplied to the gate of the transistor T22. A signal BIASb of the "H" level is supplied to the gate of the transistor T23. Thus, the transistors T22 and T23 are turned off and on, respectively. Therefore, the bit line BLb is charged to the voltage VERA via the transistor T23.

By operating as described above, the bit line connector BLHU can charge a channel of the NAND string NS to the voltage VERA via the bit line BLb in the period from the time t3 to the time t4.

1.3 Effects Related to First Embodiment

According to the first embodiment, the bit line BLa<0> is connected between the memory cell transistor MT provided in the block BLKx and the sense amplifier unit SAU<0>. The bit line BLa<0> is connected between the memory cell transistor MT provided in the block BLK(x+1) and the sense amplifier unit SAU<0>. The bit lines BLa<0> and BLb<0> are associated with the same column address CAd. Thus, when the block BLKx is selected, the bit line BLa<0> is charged, and the bit line BLb<0> is in the floating state. When the block BLK(x+1) is selected, the bit line BLb<0> is charged, and the bit line BLa<0> is in the floating state. Therefore, the length of the bit line BL to be charged can be shortened as compared with a case where both the blocks BLKx and BLK(x+1) are selected by the same bit line BL. Accordingly, an increase in parasitic capacitance generated in the bit line BL can be prevented, which can prevent an increase in current consumption.

Further, a group of the bit lines BLa and BLb is connected in parallel to one sense amplifier unit SAU. Thus, the region occupied by the sense amplifier unit SAU can be reduced as compared with a case where a group of the bit lines BLa and BLb is connected to different sense amplifier units SAU.

Further, a group of ends of the bit lines BLa and BLb opposite to each other in the Y direction overlaps with the member SLT when viewed in the Z direction. Thus, a processing of dividing the bit lines BLa and BLb has less effect on the other structure of the memory cell array 10. Therefore, an increase in the manufacturing load of the memory cell array 10 can be prevented.

Further, a group of ends of the bit lines BLa and BLb opposite to each other in the Y direction overlaps with the corresponding sense amplifier unit SAU when viewed in the Z direction. Thus, each of the bit lines BLa and BLb and the corresponding sense amplifier unit SAU can be connected by the contact V extending in the Z direction. Therefore, an increase in the design load of the wiring between each of the bit lines BLa and BLb and the corresponding sense amplifier unit SAU can be prevented.

2. Second Embodiment

Next, a second embodiment will be described.

In the second embodiment, a pattern of the bit lines BL connected to the block BLK depending on a positional relationship between the block BLK and the tier T is different from that of the first embodiment.

Hereinafter, the configuration and operation different from those of the first embodiment will be mainly described. The description of the configuration and operation equivalent to those of the first embodiment will be omitted as appropriate.

2.1 Planar Layout of Sense Amplifier Unit and Bit Line

Figure 17:
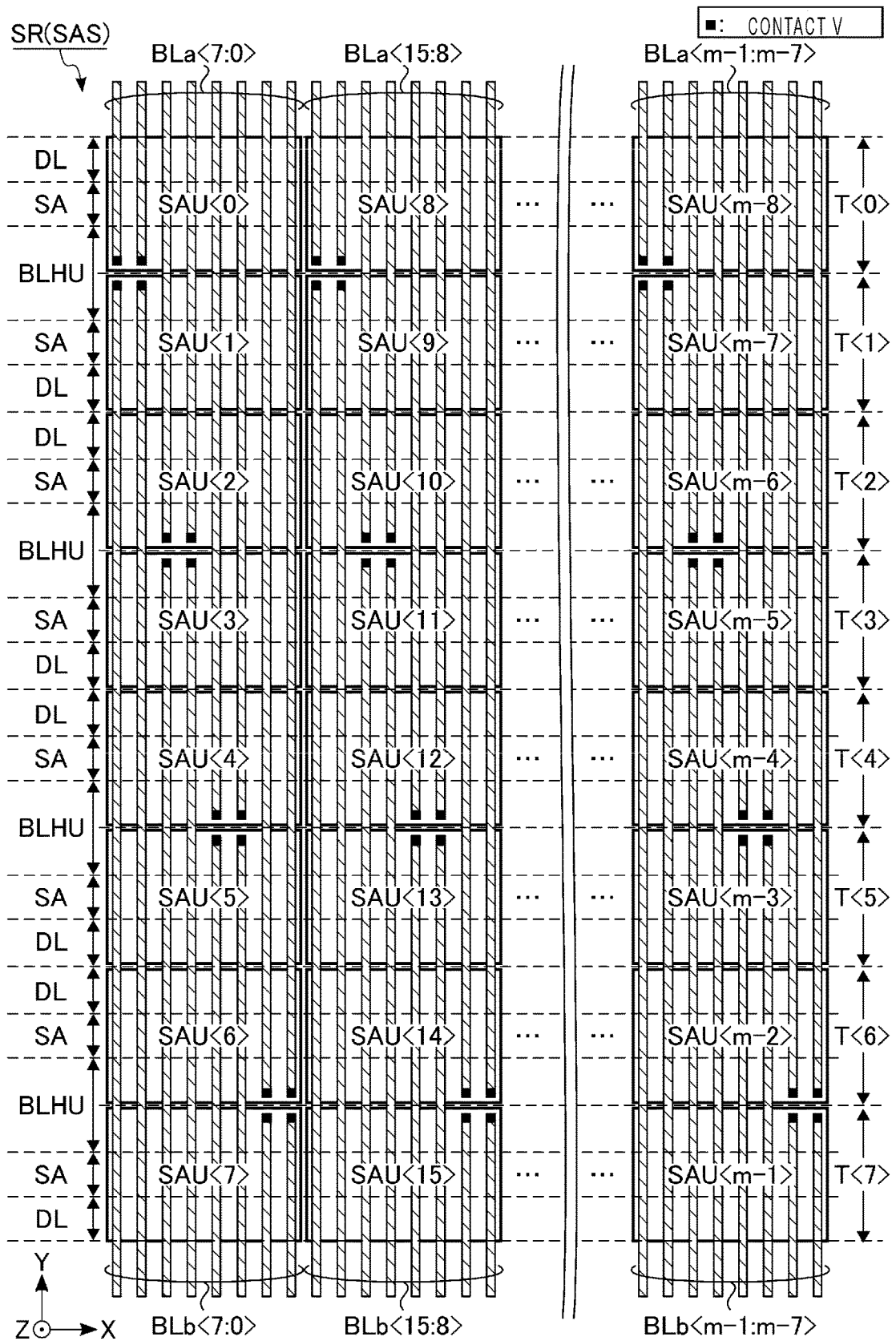
FIG. 17 is a plan view illustrating an example of a planar layout of sense amplifier units of a sense amplifier module and bit lines of a memory device according to a second embodiment.

FIG. 17 is a plan view illustrating an example of a planar layout of sense amplifier units of a sense amplifier module and bit lines of a memory device according to a second embodiment. FIG. 17 corresponds to FIG. 7 in the first embodiment.

As illustrated in FIG. 17, the bit line connector BLHU, the sense amplifier SA, and the plurality of latch circuits DL of each of the sense amplifier units SAU provided in the tiers T<0>, T<2>, T<4>, and T<6> are arranged in this order in the +Y direction. The bit line connector BLHU, the sense amplifier SA, and the plurality of latch circuits DL of each of the sense amplifier units SAU provided in the tiers T<1>, T<3>, T<5>, and T<7> are arranged in this order in the −Y direction. Then, the arrangement region of the bit line connector BLHU of each of the tiers T<0> and T<1> is shared in the boundary region of the tiers T<0> and T<1>. Similarly, the arrangement region of the bit line connector BLHU of each of the tiers T<2> and T<3> is shared in the boundary region of the tiers T<2> and T<3>. The arrangement region of the bit line connector BLHU of each of the tiers T<4> and T<5> is shared in the boundary region of the tiers T<4> and T<5>. The arrangement region of the bit line connector BLHU of each of the tiers T<6> and T<7> is shared in the boundary region of the tiers T<6> and T<7>.

The ends of each of the bit lines BLa<0> and BLb<0> and the bit lines BLa<1> and BLb<1> adjacent to each other in the Y direction are provided, respectively, at positions overlapping with the boundary region of the tiers T<0> and T<1> when viewed in the Z direction. A space between the bit lines BLa<0> and BLb<0> and a space between the bit lines BLa<1> and BLb<1> are arranged in the X direction in the boundary region of the tiers T<0> and T<1>. Each of the ends of the bit lines BLa<0> and BLb<0> adjacent to each other in the Y direction is connected to the bit line connector BLHU of the sense amplifier unit SAU<0> via the contact V. Each of the ends of the bit lines BLa<1> and BLb<1> adjacent to each other in the Y direction is connected to the bit line connector BLHU of the sense amplifier unit SAU<1> via the contact V.

The ends of each of the bit lines BLa<2> and BLb<2> and the bit lines BLa<3> and BLb<3> adjacent to each other in the Y direction are provided, respectively, at positions overlapping with the boundary region of the tiers T<2> and T<3> when viewed in the Z direction. A space between the bit lines BLa<2> and BLb<2> and a space between the bit lines BLa<3> and BLb<3> are arranged in the X direction in the boundary region of the tiers T<2> and T<3>. Each of the ends of the bit lines BLa<2> and BLb<2> adjacent to each other in the Y direction is connected to the bit line connector BLHU of the sense amplifier unit SAU<2> via the contact V. Each of the ends of the bit lines BLa<3> and BLb<3> adjacent to each other in the Y direction is connected to the bit line connector BLHU of the sense amplifier unit SAU<3> via the contact V.

The ends of each of the bit lines BLa<4> and BLb<4> and the bit lines BLa<5> and BLb<5> adjacent to each other in the Y direction are provided, respectively, at positions overlapping with the boundary region of the tiers T<4> and T<5> when viewed in the Z direction. A space between the bit lines BLa<4> and BLb<4> and a space between the bit lines BLa<5> and BLb<5> are arranged in the X direction in the boundary region of the tiers T<4> and T<5>. Each of the ends of the bit lines BLa<4> and BLb<4> adjacent to each other in the Y direction is connected to the bit line connector BLHU of the sense amplifier unit SAU<4> via the contact V. Each of the ends of the bit lines BLa<5> and BLb<5> adjacent to each other in the Y direction is connected to the bit line connector BLHU of the sense amplifier unit SAU<5> via the contact V.

The ends of each of the bit lines BLa<6> and BLb<6> and the bit lines BLa<7> and BLb<7> adjacent to each other in the Y direction are provided, respectively, at positions overlapping with the boundary region of the tiers T<6> and T<7> when viewed in the Z direction. A space between the bit lines BLa<6> and BLb<6> and a space between the bit lines BLa<7> and BLb<7> are arranged in the X direction in the boundary region of the tiers T<6> and T<7>. Each of the ends of the bit lines BLa<6> and BLb<6> adjacent to each other in the Y direction is connected to the bit line connector BLHU of the sense amplifier unit SAU<6> via the contact V. Each of the ends of the bit lines BLa<7> and BLb<7> adjacent to each other in the Y direction is connected to the bit line connector BLHU of the sense amplifier unit SAU<7> via the contact V.

The positional relationship between the eight groups of the bit lines BLa and BLb and the sense amplifier group SAG as described above is repeated in the X direction over the sense amplifier region SR.

2.2 Connection Relationship between Sense Amplifier Unit, Block, and Bit Line

FIG. 18 is a diagram illustrating an example of a connection relationship between the sense amplifier units, blocks, and bit lines of the memory device according to the second embodiment. FIG. 18 corresponds to FIG. 10 in the first embodiment.

As illustrated in FIG. 18, the block BLK located on the +Y direction side of the tier T<0> and the block BLK located at a position overlapping with the tier T<0> when viewed in the Z direction are connected to the sense amplifier units SAU provided in all the tiers T<0> to T<7> via the bit lines BLa.

The blocks BLK located at positions overlapping with the tiers T<1> and T<2> when viewed in the Z direction are connected to the sense amplifier units SAU provided in the tiers T<0> and T<1> via the bit lines BLb. The blocks BLK located at the positions overlapping with the tiers T<1> and T<2> when viewed in the Z direction are connected to the sense amplifier units SAU provided in the tiers T<2> to T<7> via the bit lines BLa.

The blocks BLK located at the positions overlapping with the tiers T<3> and T<4> when viewed in the Z direction are connected to the sense amplifier units SAU provided in the tiers T<0> to T<3> via the bit lines BLb. The blocks BLK located at the positions overlapping with the tiers T<3> and T<4> when viewed in the Z direction are connected to the sense amplifier units SAU provided in the tiers T<4> to T<7> via the bit lines BLa.

The blocks BLK located at positions overlapping with the tiers T<5> and T<6> when viewed in the Z direction are connected to the sense amplifier units SAU provided in the tiers T<0> to T<5> via the bit lines BLb. The blocks BLK located at the positions overlapping with the tiers T<5> and T<6> when viewed in the Z direction are connected to the sense amplifier units SAU provided in the tiers T<6> and T<7> via the bit lines BLa.

The block BLK located at a position overlapping with the tier T<7> and the block BLK located on the −Y direction side of the tier T<7> when viewed in the Z direction are connected to the sense amplifier units SAU provided in all the tiers T<0> to T<7> via the bit lines BLb.

2.3 Effects Related to Second Embodiment

According to the second embodiment, the bit lines BLa<0>, BLb<0>, BLa<1>, and BLb<1> are simultaneously formed by a processing of integrating and dividing two wirings adjacent to each other in the X direction. Thus, a group of opposite ends of the bit lines BLa<0> and BLb<0> and a group of opposite ends of the bit lines BLa<1> and BLb<1> overlap with the same member BLT when viewed in the Z direction. Therefore, the accuracy required for the division of the wirings can be reduced to two wirings. Accordingly, an increase in the manufacturing load of the bit lines BLa and BLb can be prevented.

Further, a group of opposite ends of the bit lines BLa<0> and BLb<0> and a group of opposite ends of the bit lines BLa<1> and BLb<1> overlap with the boundary region of the sense amplifier units SAU<0> and SAU<1> when viewed in the Z direction. Thus, each of the bit lines BLa<0> and BLb<0> can be connected to the sense amplifier unit SAU<0> by the contact V, and each of the bit lines BLa<1> and BLb<1> can be connected to the sense amplifier unit SAU<1> by the contact V.

3. Third Embodiment

Next, a third embodiment will be described.

In the third embodiment, a pattern of the bit lines BL connected to the block BLK depending on a positional relationship between the block BLK and the tier T is different from those of the first embodiment and the second embodiment. Hereinafter, the configuration and operation different from those of the first embodiment and the second embodiment will be mainly described. The description of the configuration and operation equivalent to those of the first embodiment and the second embodiment will be omitted as appropriate.

3.1 Planar Layout of Sense Amplifier Unit and Bit Line

Figure 19:
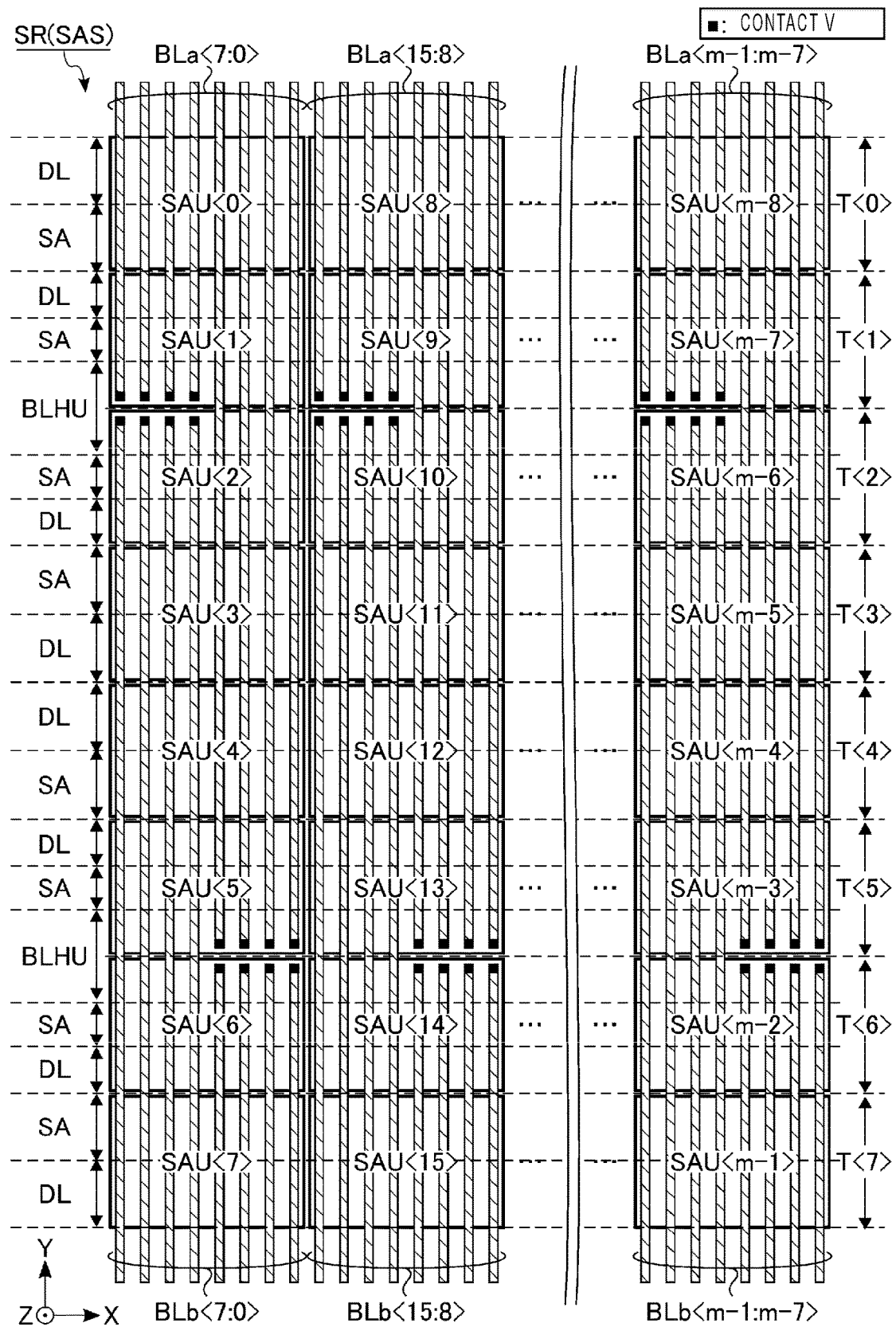
FIG. 19 is a plan view illustrating an example of a planar layout of sense amplifier units of a sense amplifier module and bit lines of a memory device according to a third embodiment.

FIG. 19 is a plan view illustrating an example of a planar layout of sense amplifier units of a sense amplifier module and bit lines of a memory device according to a third embodiment. FIG. 19 corresponds to FIG. 7 in the first embodiment.

As illustrated in FIG. 19, the bit line connector BLHU, the sense amplifier SA, and the plurality of latch circuits DL of each of the sense amplifier units SAU provided in the tiers T<0>, T<1>, T<4>, and T<5> are arranged in this order in the +Y direction. The bit line connector BLHU, the sense amplifier SA, and the plurality of latch circuits DL of each of the sense amplifier units SAU provided in the tiers T<2>, T<3>, T<6>, and T<7> are arranged in this order in the −Y direction. Then, the arrangement region of the bit line connector BLHU of each of the tiers T<0> to T<3> is shared in the boundary region of the tiers T<1> and T<2>. Similarly, the arrangement region of the bit line connector BLHU of each of the tiers T<4> to T<7> is shared in the boundary region of the tiers T<5> and T<6>.

The ends of each of the bit lines BLa<0> and BLb<0>, the bit lines BLa<1> and BLb<1>, the bit lines BLa<2> and BLb<2>, and the bit lines BLa<3> and BLb<3> adjacent to each other in the Y direction are provided, respectively, at positions overlapping with the boundary region of the tiers T<1> and T<2>. A space between the bit lines BLa<0> and BLb<0>, a space between the bit lines BLa<1> and BLb<1>, a space between the bit lines BLa<2> and BLb<2>, and a space between the bit lines BLa<3> and BLb<3> are arranged in the X direction in the boundary region of the tiers T<1> and T<2>.

Each of the ends of the bit lines BLa<0> and BLb<0> adjacent to each other in the Y direction is connected to the bit line connector BLHU of the sense amplifier unit SAU<0> via the contact V. Each of the ends of the bit lines BLa<1> and BLb<1> adjacent to each other in the Y direction is connected to the bit line connector BLHU of the sense amplifier unit SAU<1> via the contact V. Each of the ends of the bit lines BLa<2> and BLb<2> adjacent to each other in the Y direction is connected to the bit line connector BLHU of the sense amplifier unit SAU<2> via the contact V. Each of the ends of the bit lines BLa<3> and BLb<3> adjacent to each other in the Y direction is connected to the bit line connector BLHU of the sense amplifier unit SAU<3> via the contact V.

The ends of each of the bit lines BLa<4> and BLb<4>, the bit lines BLa<5> and BLb<5>, the bit lines BLa<6> and BLb<6>, and the bit lines BLa<7> and BLb<7> adjacent to each other in the Y direction are provided, respectively, at positions overlapping with the boundary region of the tiers T<5> and T<6> when viewed in the Z direction. A space between the bit lines BLa<4> and BLb<4>, a space between the bit lines BLa<5> and BLb<5>, a space between the bit lines BLa<6> and BLb<6>, and a space between the bit lines BLa<7> and BLb<7> are arranged in the X direction in the boundary region of the tiers T<5> and T<6>.

Each of the ends of the bit lines BLa<4> and BLb<4> adjacent to each other in the Y direction is connected to the bit line connector BLHU of the sense amplifier unit SAU<4> via the contact V. Each of the ends of the bit lines BLa<5> and BLb<5> adjacent to each other in the Y direction is connected to the bit line connector BLHU of the sense amplifier unit SAU<5> via the contact V. Each of the ends of the bit lines BLa<6> and BLb<6> adjacent to each other in the Y direction is connected to the bit line connector BLHU of the sense amplifier unit SAU<6> via the contact V. Each of the ends of the bit lines BLa<7> and BLb<7> adjacent to each other in the Y direction is connected to the bit line connector BLHU of the sense amplifier unit SAU<7> via the contact V.

The positional relationship between the eight groups of the bit lines BLa and BLb and the sense amplifier group SAG as described above is repeated in the X direction over the sense amplifier region SR.

3.2 Connection Relationship between Sense Amplifier Unit, Block, and Bit Line

FIG. 20 is a diagram illustrating an example of a connection relationship between the sense amplifier units, blocks, and bit lines of the memory device according to the third embodiment. FIG. 20 corresponds to FIG. 10 in the first embodiment.

As illustrated in FIG. 20, the block BLK located on the +Y direction side of the tier T<0> and the blocks BLK located at positions overlapping with the tiers T<0> and T<1> when viewed in the Z direction are connected to the sense amplifier units SAU provided in all the tiers T<0> to T<7> via the bit lines BLa.

The blocks BLK located at positions overlapping with the tiers T<2> to T<5> when viewed in the Z direction are connected to the sense amplifier units SAU provided in the tiers T<0> to T<3> via the bit lines BLb. The blocks BLK located at the positions overlapping with the tiers T<2> to T<5> when viewed in the Z direction are connected to the sense amplifier units SAU provided in the tiers T<4> to T<7> via the bit lines BLa.

The blocks BLK located at positions overlapping with the tiers T<6> and T<7> and the block BLK located on the −Y direction side of the tier T<7> when viewed in the Z direction are connected to the sense amplifier units SAU provided in all the tiers T<0> to T<7> via the bit lines BLb.

3.3 Effects Related to Third Embodiment

According to the third embodiment, the bit lines BLa<0> to BLa<3> and BLb<0> to BLb<3> are simultaneously formed by a processing of integrating and dividing four wirings adjacent to each other in the X direction. Thus, a group of opposite ends of the bit lines BLa<0> and BLb<0>, a group of opposite ends of the bit lines BLa<1> and BLb<1>, a group of opposite ends of the bit lines BLa<2> and BLb<2>, and a group of opposite ends of the bit lines BLa<3> and BLb<3> overlap with the same member BLT when viewed in the Z direction. Therefore, the accuracy required for the division of the wirings can be reduced to four wirings. Accordingly, an increase in the manufacturing load of the bit lines BLa and BLb can be prevented.

Further, a group of opposite ends of the bit lines BLa<0> and BLb<0>, a group of opposite ends of the bit lines BLa<1> and BLb<1>, a group of opposite ends of the bit lines BLa<2> and BLb<2>, and a group of opposite ends of the bit lines BLa<3> and BLb<3> overlap with the boundary region of the sense amplifier units SAU<1> and SAU<2> when viewed in the Z direction. Thus, each of the bit lines BLa<1> and BLb<1> can be connected to the sense amplifier unit SAU<1> by the contact V, and each of the bit lines BLa<2> and BLb<2> can be connected to the sense amplifier unit SAU<2> by the contact V.

Further, the bit line connector BLHU of the sense amplifier unit SAU<0> and the bit line connector BLHU of the sense amplifier unit SAU<3> are formed in the boundary region of the sense amplifier units SAU<1> and SAU<2>. Thus, each of the bit lines BLa<0> and BLb<0> can also be connected to the sense amplifier unit SAU<0> by the contact V, and each of the bit lines BLa<3> and BLb<3> can also be connected to the sense amplifier unit SAU<3> by the contact V.

4. Fourth Embodiment

Next, a fourth embodiment will be described.

In the fourth embodiment, a planar layout of the sense amplifier module 16 and a connection relationship between the sense amplifier module 16 and the bit lines BLa and BLb are the same as those in the first embodiment. However, in the fourth embodiment, a cut pattern of the bit lines BL is different from that in the first embodiment. Hereinafter, the configuration and operation different from those of the first embodiment will be mainly described. The description of the configuration and operation equivalent to those of the first embodiment will be omitted as appropriate.

4.1 Planar Layout of Sense Amplifier Unit and Bit Line

Figure 21:
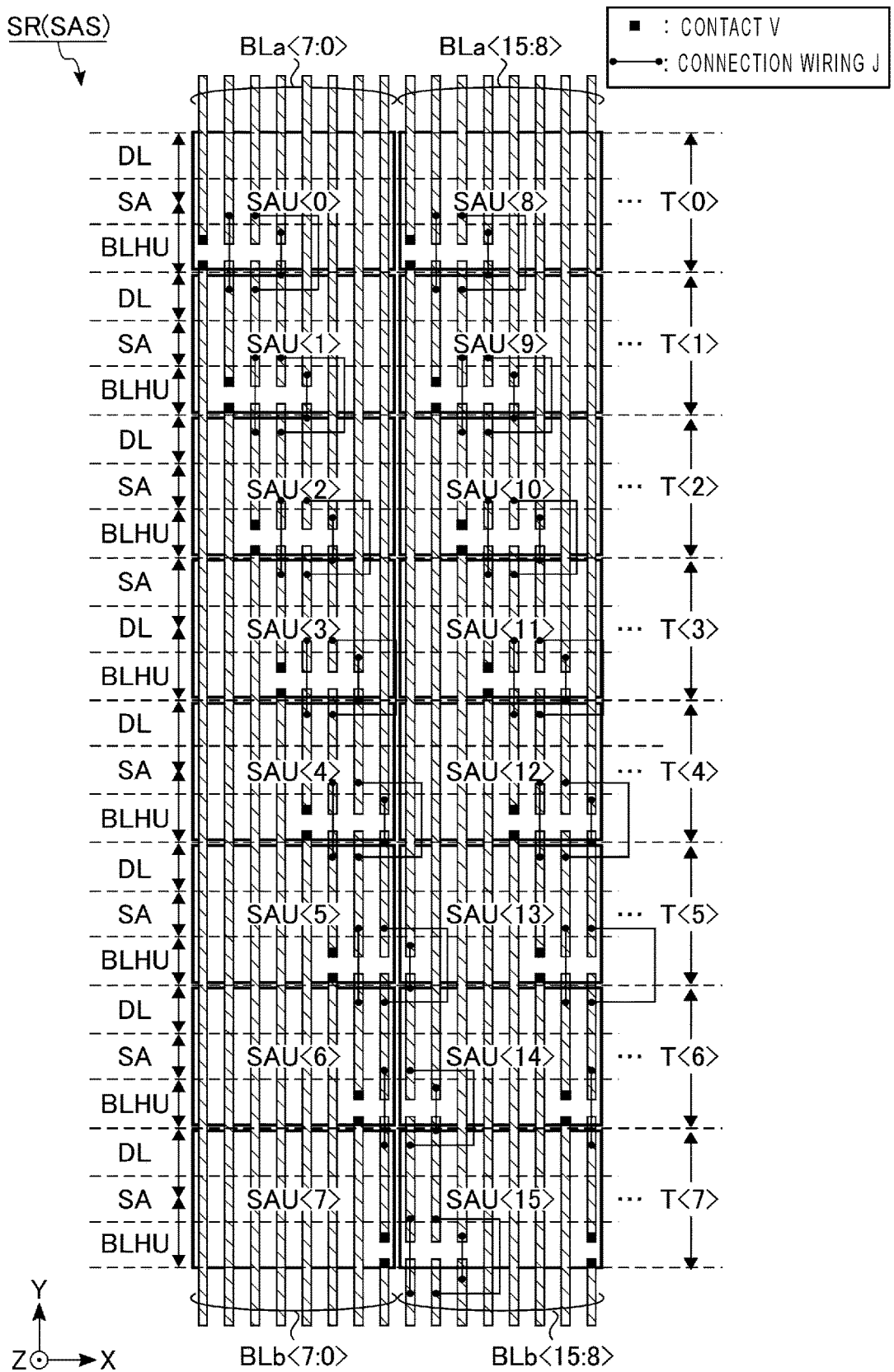
FIG. 21 is a plan view illustrating an example of a planar layout of sense amplifier units of a sense amplifier module and bit lines of a memory device according to a fourth embodiment.

FIG. 21 is a plan view illustrating an example of a planar layout of sense amplifier units of a sense amplifier module and bit lines of a memory device according to a fourth embodiment. FIG. 21 corresponds to FIG. 7 in the first embodiment.

In the example of FIG. 21, a planar layout of the sense amplifier module 16 and a connection relationship between the sense amplifier module 16 and the bit lines BLa and BLb are the same as in the case of FIG. 7.

It is noted that, in the example of FIG. 21, each of the bit lines BLa<1> to BLa<3> is divided in the Y direction at the same position as the position at which the bit lines BLa<0> and BLb<0> are divided in the tier T<0>. In the tier T<0>, the bit lines BLa<1> to BLa<3> each of which is divided into two are electrically connected by different connection wirings J, respectively.

Each of the bit lines BLa<2> to BLa<4> is divided in the Y direction at the same position as the position at which the bit lines BLa<1> and BLb<1> are divided in the tier T<1>. In the tier T<1>, the bit lines BLa<2> to BLa<4> each of which is divided into two are electrically connected by different connection wirings J, respectively.

Each of the bit lines BLa<3> to BLa<5> is divided in the Y direction at the same position as the position at which the bit lines BLa<2> and BLb<2> are divided in the tier T<2>. In the tier T<2>, the bit lines BLa<3> to BLa<5> each of which is divided into two are electrically connected by different connection wirings J, respectively.

Each of the bit lines BLa<4> to BLa<6> is divided in the Y direction at the same position as the position at which the bit lines BLa<3> and BLb<3> are divided in the tier T<3>. In the tier T<3>, the bit lines BLa<4> to BLa<6> each of which is divided into two are electrically connected by different connection wirings J, respectively.

Each of the bit lines BLa<5> to BLa<7> is divided in the Y direction at the same position as the position at which the bit lines BLa<4> and BLb<4> are divided in the tier T<4>. In the tier T<4>, the bit lines BLa<5> to BLa<7> each of which is divided into two are electrically connected by different connection wirings J, respectively.

Each of the bit lines BLa<6>, BLa<7>, and BLa<8> is divided in the Y direction at the same position as the position at which the bit lines BLa<5> and BLb<5> are divided in the tier T<5>. In the tier T<5>, the bit lines BLa<6>, BLa<7>, and BLa<8> each of which is divided into two are electrically connected by different connection wirings J, respectively.

Each of the bit lines BLa<7>, BLb<8>, and BLb<9> is divided in the Y direction at the same position as the position at which the bit lines BLa<6> and BLb<6> are divided in the tier T<6>. In the tier T<6>, the bit lines BLa<7>, BLb<8>, and BLb<9> each of which is divided into two are electrically connected by different connection wirings J, respectively.

Each of the bit lines BLb<8> to BLb<10> is divided in the Y direction at the same position as the position at which the bit lines BLa<7> and BLb<7> are divided in the tier T<7>. In the tier T<7>, the bit lines BLb<8> to BLb<10> each of which is divided into two are electrically connected by different connection wirings J, respectively.

The positional relationship between the eight groups of the bit lines BLa and BLb and the sense amplifier group SAG as described above is repeated in the X direction over the sense amplifier region SR. 4.2 Effects Related to Fourth Embodiment According to the fourth embodiment, the bit lines BLa<0> and BLb<0> are formed and at the same time, each of the bit lines BLa<1> to BLa<3> is divided into two by a processing of integrating and dividing four wirings adjacent to each other in the X direction. Thus, a group of opposite ends of the bit lines BLa<0> and BLb<0> and three groups of opposite ends of the bit lines BLa<1> and BLa<3> each of which is divided into two overlap with the same member BLT when viewed in the Z direction. Therefore, the accuracy required for the division of the wirings can be reduced to four wirings. Accordingly, as in the third embodiment, an increase in the manufacturing load of the bit lines BLa and BLb can be prevented.

Further, the bit lines BLa<1> to BLa<3> each of which is divided into two are electrically connected by different connection wirings J, respectively. Thus, the bit line BLa<1> which is divided into two, the bit line BLa<2> which is divided into two, and the bit line BLa<3> which is divided into two respectively function as one bit line BLa<1>, one bit line BLa<2>, and one bit line BLa<3>. Therefore, all the bit lines BLa and BLb have substantially the same function as the bit lines BLa and BLb in the first embodiment.

5. Fifth Embodiment

Next, a fifth embodiment will be described.

In the fifth embodiment, a planar layout of the sense amplifier module 16 is the same as that in the first embodiment However, in the fifth embodiment, a connection relationship between the sense amplifier module 16 and the bit lines BLa and BLb and a cut pattern of the bit lines BL are different from those of the fifth embodiment. Hereinafter, the configuration and operation different from those of the first embodiment will be mainly described. The description of the configuration and operation equivalent to those of the first embodiment will be omitted as appropriate.

5.1 Planar Layout of Sense Amplifier Unit and Bit Line

Figure 22:
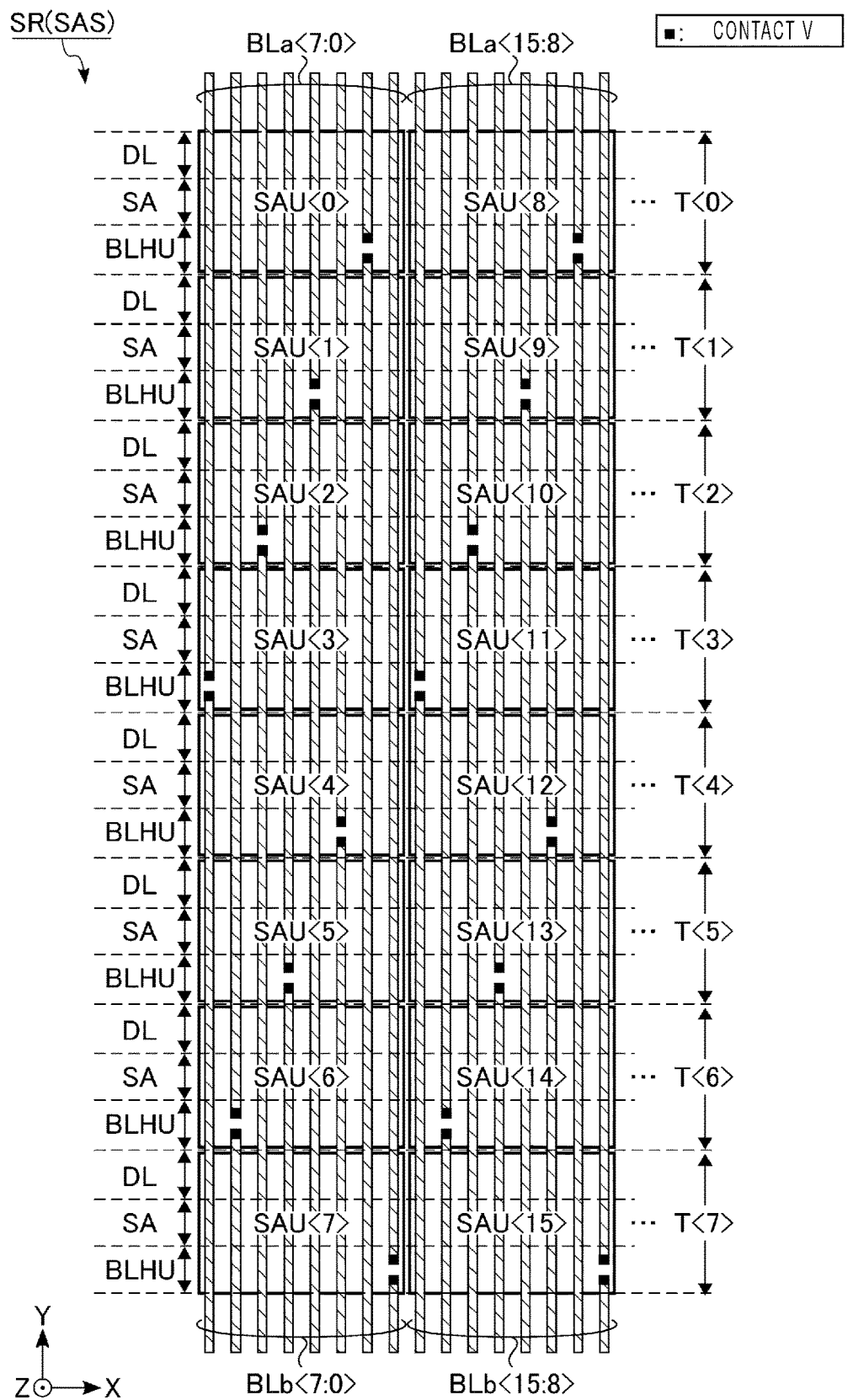
FIG. 22 is a plan view illustrating an example of a planar layout of sense amplifier units of a sense amplifier module and bit lines of a memory device according to a fifth embodiment.

FIG. 22 is a plan view illustrating an example of a planar layout of sense amplifier units of a sense amplifier module and bit lines of a memory device according to a fifth embodiment. FIG. 22 corresponds to FIG. 7 in the first embodiment.

In the example of FIG. 22, a planar layout of the sense amplifier module 16 is the same as the case of FIG. 7.

It is noted that, each of the ends of the bit lines BLa<0> and BLb<0> adjacent to each other in the Y direction is provided at a position overlapping with the bit line connector BLHU of the sense amplifier unit SAU<3> when viewed in the Z direction. Each of the ends of the bit lines BLa<0> and BLb<0> adjacent to each other in the Y direction is connected to the bit line connector BLHU of the sense amplifier unit SAU<3> via the contact V.

Each of the ends of the bit lines BLa<1> and BLb<1> adjacent to each other in the Y direction is provided at a position overlapping with the bit line connector BLHU of the sense amplifier unit SAU<6> when viewed in the Z direction. Each of the ends of the bit lines BLa<1> and BLb<1> adjacent to each other in the Y direction is connected to the bit line connector BLHU of the sense amplifier unit SAU<6> via the contact V.

Each of the ends of the bit lines BLa<2> and BLb<2> adjacent to each other in the Y direction is provided at a position overlapping with the bit line connector BLHU of the sense amplifier unit SAU<2> when viewed in the Z direction. Each of the ends of the bit lines BLa<2> and BLb<2> adjacent to each other in the Y direction is connected to the bit line connector BLHU of the sense amplifier unit SAU<2> via the contact V.

Each of the ends of the bit lines BLa<3> and BLb<3> adjacent to each other in the Y direction is provided at a position overlapping with the bit line connector BLHU of the sense amplifier unit SAU<5> when viewed in the Z direction. Each of the ends of the bit lines BLa<3> and BLb<3> adjacent to each other in the Y direction is connected to the bit line connector BLHU of the sense amplifier unit SAU<5> via the contact V.

Each of the ends of the bit lines BLa<4> and BLb<4> adjacent to each other in the Y direction is provided at a position overlapping with the bit line connector BLHU of the sense amplifier unit SAU<1> when viewed in the Z direction. Each of the ends of the bit lines BLa<4> and BLb<4> adjacent to each other in the Y direction is connected to the bit line connector BLHU of the sense amplifier unit SAU<1> via the contact V.

Each of the ends of the bit lines BLa<5> and BLb<5> adjacent to each other in the Y direction is provided at a position overlapping with the bit line connector BLHU of the sense amplifier unit SAU<4> when viewed in the Z direction. Each of the ends of the bit lines BLa<5> and BLb<5> adjacent to each other in the Y direction is connected to the bit line connector BLHU of the sense amplifier unit SAU<4> via the contact V.

Each of the ends of the bit lines BLa<6> and BLb<6> adjacent to each other in the Y direction is provided at a position overlapping with the bit line connector BLHU of the sense amplifier unit SAU<0> when viewed in the Z direction. Each of the ends of the bit lines BLa<6> and BLb<6> adjacent to each other in the Y direction is connected to the bit line connector BLHU of the sense amplifier unit SAU<0> via the contact V.

Each of the ends of the bit lines BLa<7> and BLb<7> adjacent to each other in the Y direction is provided at a position overlapping with the bit line connector BLHU of the sense amplifier unit SAU<7> when viewed in the Z direction. Each of the ends of the bit lines BLa<7> and BLb<7> adjacent to each other in the Y direction is connected to the bit line connector BLHU of the sense amplifier unit SAU<7> via the contact V.

The positional relationship between the eight groups of the bit lines BLa and BLb and the sense amplifier group SAG as described above is repeated in the X direction over the sense amplifier region SR.

5.2 Effects Related to Fifth Embodiment

According to the fifth embodiment, the bit line BLa<1> is adjacent to any of the bit lines BLa<0> and BLb<0>. Further, the bit line BLa<1> is adjacent to any of the bit lines BLa<2> and BLb<2>. Thus, when any one block BLK is selected, an increase in the coupling capacitance between adjacent bit lines BL can be prevented. Therefore, an increase in current consumption can be prevented.

Supplementally, the coupling capacitance between one bit line BL and another bit line BL mainly occurs when two bit lines BL adjacent to that one bit line BL are selected. The magnitude of that coupling capacitance increases according to the length of a portion in which that one bit line BL and each of the two adjacent bit lines BL extend in parallel. In various operations such as a write operation, a read operation, and an erase operation, it is desirable that the coupling capacitance between the bit lines BL be smaller.

When the bit line BL is not divided into the bit lines BLa and BLb, the magnitude of the coupling capacitance of a bit line BL_wst corresponds to 8 tiers from each of both adjacent bit lines BL, i.e., a total of 16 tiers when ignoring the influence of the bit line BL outside the sense amplifier region SR. Further, even when the bit line BL is divided into the bit lines BLa and BLb, if the division position is close to any of the division positions of both the adjacent bit lines BL, the coupling capacitance of the bit line BL_wst has the magnitude equivalent to 16 tiers according to the selected block BLK.

Meanwhile, according to the fifth embodiment, one of the bit lines BLa and BLb is designed to have a portion adjacent to any of both adjacent bit lines BLa and BLb. Thus, in the fifth embodiment, the division position of the bit line BL is designed to be separated from any of the division positions of both the adjacent bit lines BL by at least 3 tiers. Therefore, the coupling capacitance of the bit line BL_wst can be significantly reduced with respect to the magnitude corresponding to 16 tiers regardless of the selected block BLK.

Hereinafter, a specific example of the coupling capacitance of the bit line BL_wst in the fifth embodiment will be described.

Figure 23:
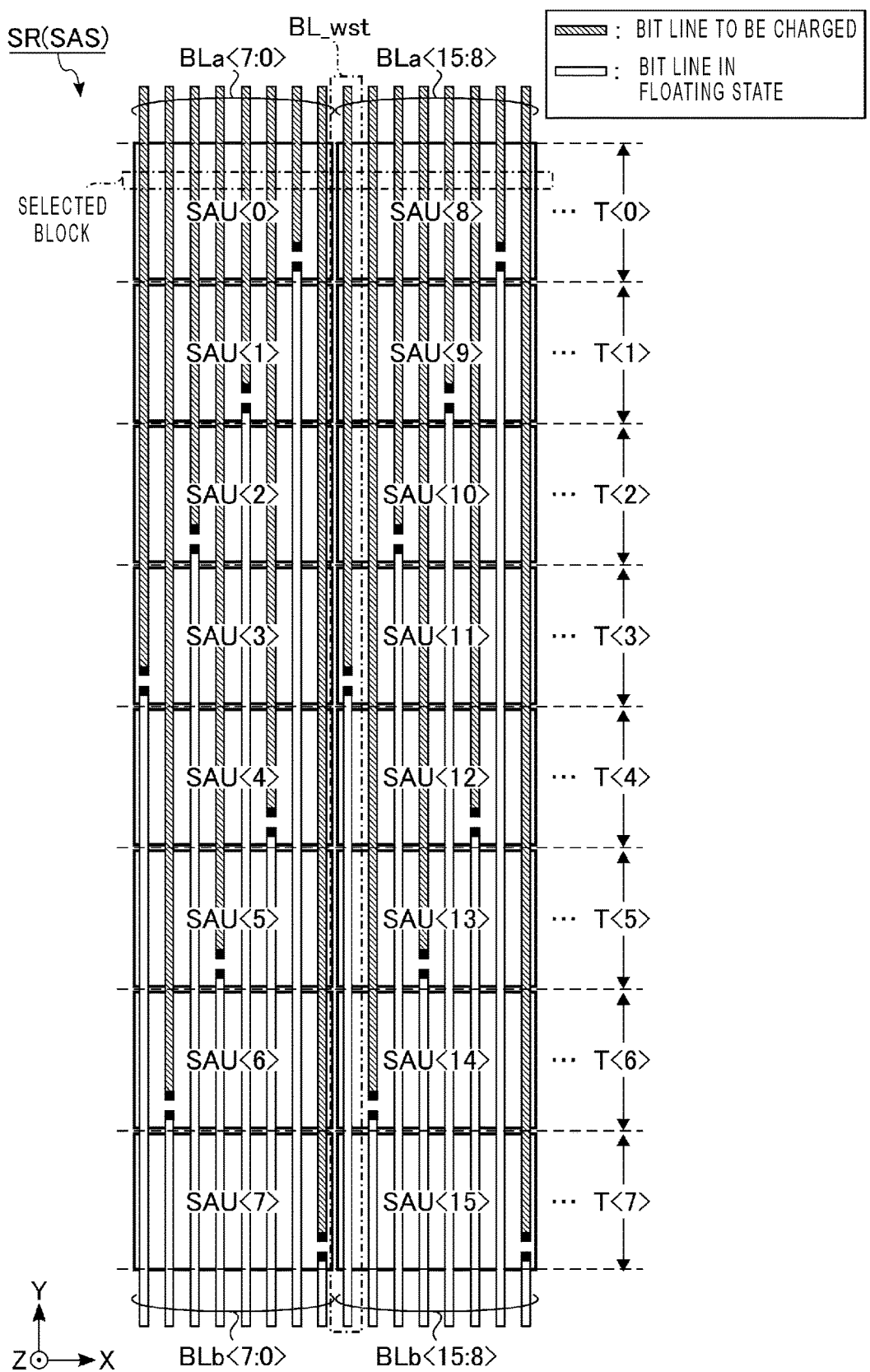
FIG. 23 is a diagram illustrating a first example of a relationship between the coupling capacitance of bit lines and a selected block in various operations in the memory device according to the fifth embodiment.

FIG. 23 is a diagram illustrating a first example of a relationship between the coupling capacitance of bit lines and a selected block in various operations in the memory device according to the fifth embodiment. The first example corresponds to a case where the block BLK corresponding to the tier T<0> is selected in various operations.

As illustrated in FIG. 23, when the block BLK corresponding to the tier T<0> is selected, all the NAND strings NS of that selected block BLK are connected to the bit lines BLa. Then, any bit line BLb is in the floating state. In this case, one bit line BL_wst having the largest coupling capacitance is the bit line BLa<8>. The magnitude of the coupling capacitance of the bit line BLa<8> is a total of 8 tiers including 4 tiers due to the bit line BLa<7> and 4 tiers due to the bit line BLa<9>. As described above, according to the fifth embodiment, when the block BLK corresponding to the tier at the end of the sense amplifier region SR is selected, the coupling capacitance of the bit line BL_wst can be significantly reduced with respect to the magnitude corresponding to 16 tiers.

Figure 24:
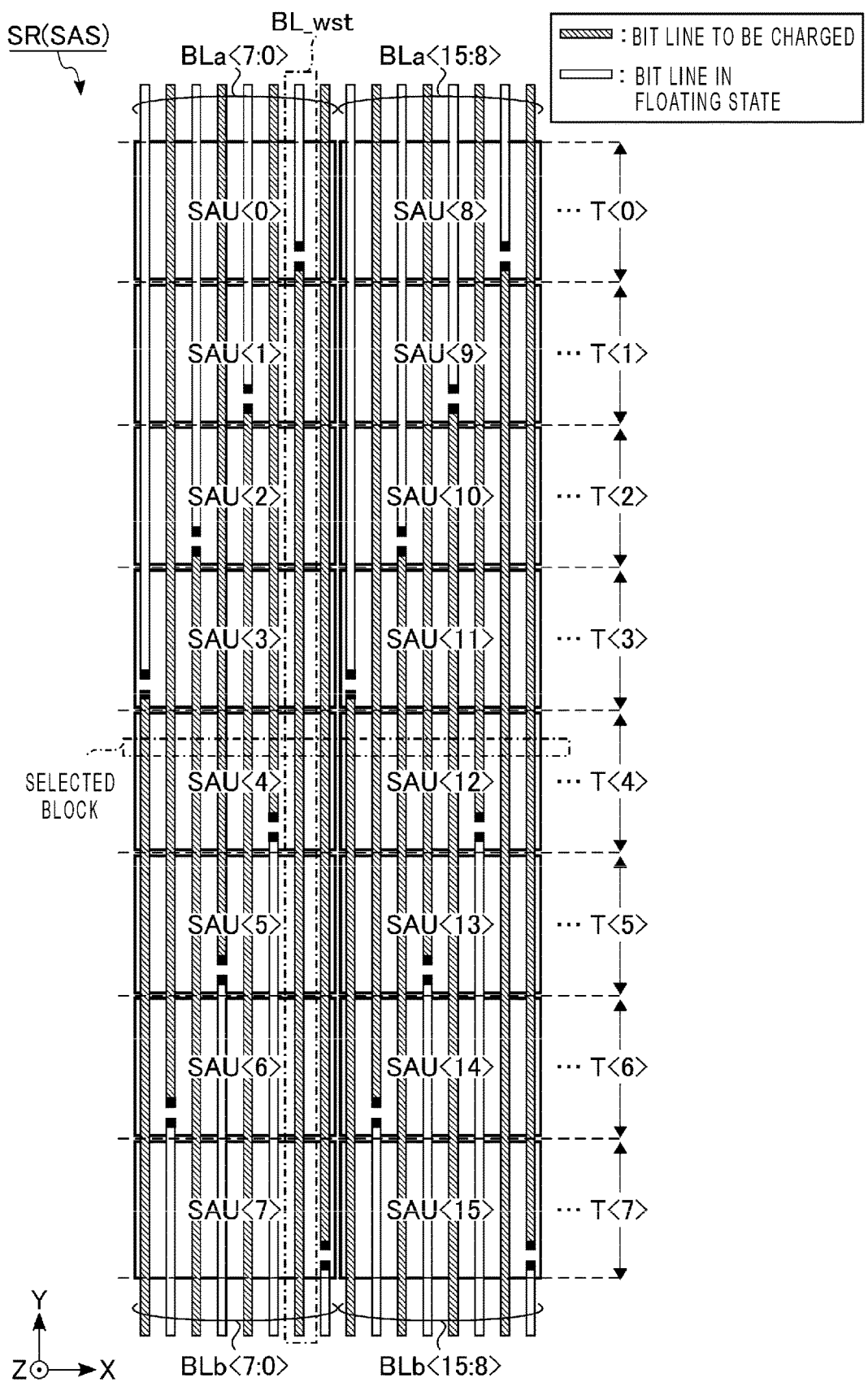
FIG. 24 is a diagram illustrating a second example of a relationship between the coupling capacitances of bit lines and a selected block in various operations in the memory device according to the fifth embodiment.

FIG. 24 is a diagram illustrating a second example of a relationship between the coupling capacitances of bit lines and a selected block in various operations in the memory device according to the fifth embodiment. The second example corresponds to a case where the block BLK corresponding to the tier T<4> is selected in various operations.

As illustrated in FIG. 24, when the block BLK corresponding to the tier T<4> is selected, the NAND strings NS of that selected block BLK are alternately connected to the bit lines BLa and BLb in the X direction. In this case, one bit lines BL_wst having the largest coupling capacitance is the bit line BLb<6>. The magnitude of the coupling capacitance of the bit line BLb<6> is a total of 11 tiers including 4 tiers due to the bit line BLa<5> and 7 tiers due to the bit line BLa<7>. As described above, according to the fifth embodiment, when the block BLK corresponding to the tier at a central portion of the sense amplifier region SR is selected, the coupling capacitance of the bit line BL_wst can be significantly reduced with respect to the magnitude corresponding to 16 tiers.

6. Sixth Embodiment

Next, a sixth embodiment will be described.

In the sixth embodiment, a positional relationship between the sense amplifier module 16 and the bit lines BLa and BLb is different from that of the first embodiment. Hereinafter, the configuration and operation different from those of the first embodiment will be mainly described. The description of the configuration and operation equivalent to those of the first embodiment will be omitted as appropriate.

6.1 Planar Layout of Sense Amplifier Unit and Bit Line

Figure 25:
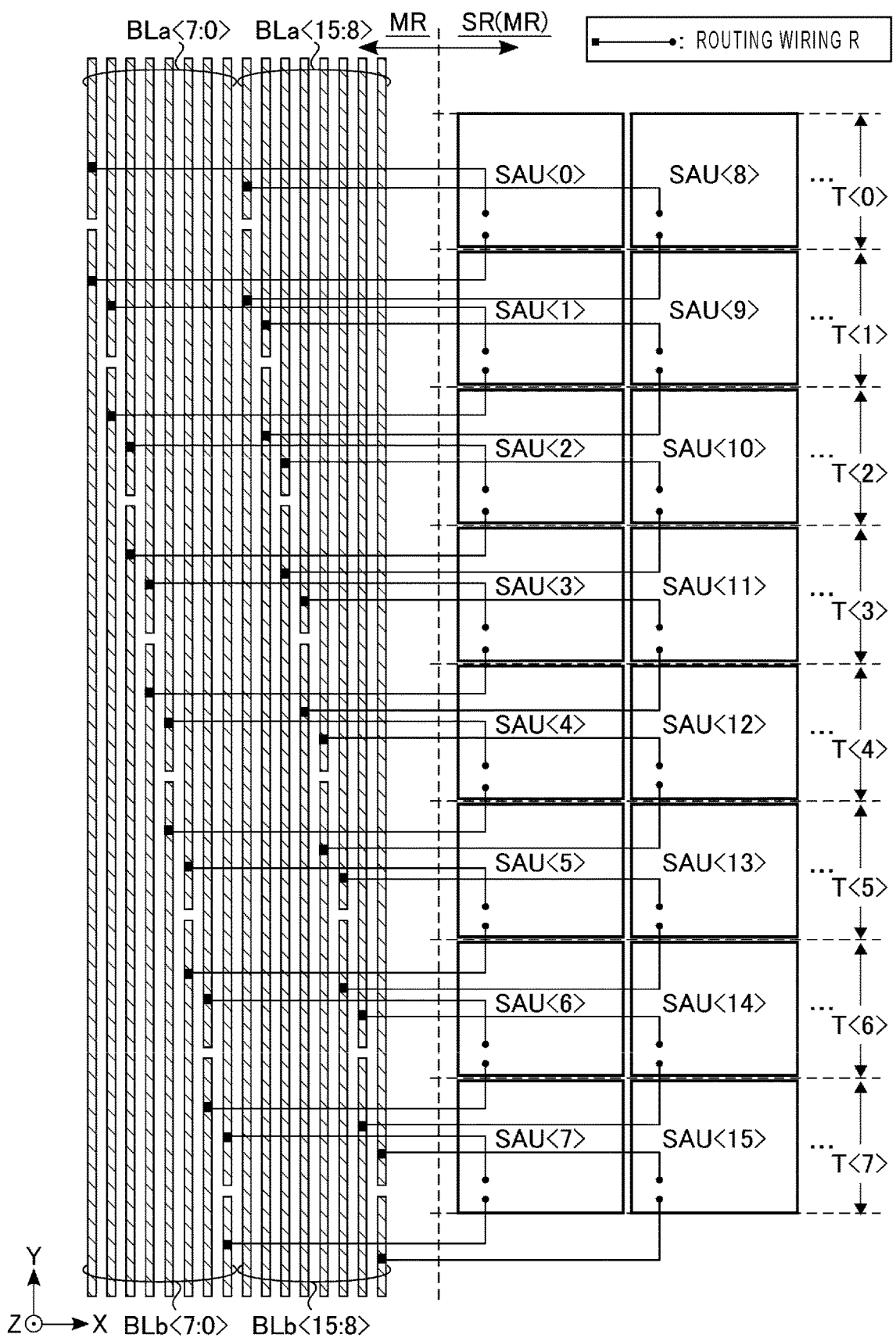
FIG. 25 is a plan view illustrating an example of a planar layout of sense amplifier units of a sense amplifier module and bit lines of a memory device according to a sixth embodiment.

FIG. 25 is a plan view illustrating an example of a planar layout of blocks and bit lines of the memory cell array of a memory device according to a sixth embodiment. FIG. 25 corresponds to FIG. 7 in the first embodiment.

As illustrated in FIG. 25, in some of eight groups of the bit lines BLa and BLb (in the example of FIG. 25, a group of the bit lines BLa<7:0> and BLb<7:0> and a group of the bit lines BLa<15:8> and BLb<15:8> are disposed outside the sense amplifier region SR when viewed in the Z direction. Then, a group of the bit lines BLa<0> and BLb<0> to a group of the bit lines BLa<7> and BLb<7> are respectively connected to the bit line connector BLHU of the sense amplifier unit SAU<7:0> via a routing wiring R including a portion extending in the X direction. Similarly, a group of the bit lines BLa<8> and BLb<8> to a group of the bit lines BLa<15> and BLb<15> are respectively connected to the bit line connector BLHU of the sense amplifier unit SAU<15:8> via the routing wiring R including a portion thereof extending in the X direction.

Although not illustrated in FIG. 25, a portion of the routing wiring R extending in the X direction is formed, for example, on the memory chip MC side. Further, the routing wiring R does not necessarily need to be connected to the end of the bit line BLa and the end of the bit line BLb.

6.2 Effects Related to Sixth Embodiment

According to the sixth embodiment, the bit lines BLa and BLb are connected to the sense amplifier unit SAU via the routing wiring R including a portion extending in the X direction. Thus, the ends of the bit lines BLa and BLb adjacent to each other in the Y direction can be disposed at positions not overlapping with the bit line connector BLHU of the sense amplifier unit SAU when viewed in the Z direction. Therefore, even when the bit lines BLa and BLb are disposed outside the sense amplifier region SR when viewed in the Z direction, the bit lines BLa and BLb can be connected to the sense amplifier unit SAU. Accordingly, the degree of freedom in the layout design of the sense amplifier region SR and the memory region MR can be enhanced.

7. Modifications, Etc.

The first to sixth embodiments are not limited to the examples described above, and various modifications are applicable.

The above-described first to sixth embodiments was described the case where the bit lines BLa and BLb are provided between the stacked wiring structure LS and the sense amplifier module 16, but are not limited thereto. For example, the stacked wiring structure LS may be provided between the bit lines BLa and BLb and the sense amplifier module 16. In this case, the memory device 3 may be formed in one chip.

Further, the above-described sixth embodiment was described the case where the cut pattern of the bit lines BL is the same as in the first embodiment, but is not limited thereto. For example, the cut pattern of the bit lines BL in the second to fifth embodiments may be applied to the sixth embodiment.

Further, the above-described sixth embodiment was described the case where the bit line BL is divided into two bit lines BLa and BLb, but is not limited thereto. For example, the bit line BL may be divided into three or more. In this case, the three or more divided bit lines BL are connected in parallel to the node ND3 of one sense amplifier unit SAU.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A three-dimensional NAND flash nonvolatile memory device comprising:
    a first memory pillar extending in a first direction;
    a first word line extending in a second direction, the second direction intersecting with the first direction;
    a first memory cell provided at an intersecting point of the first memory pillar and the first word line;
    a second memory pillar extending in the first direction and parallel to the first memory pillar;
    a second word line extending in the second direction and parallel to the first word line;
    a second memory cell provided at an intersecting point of the second memory pillar and the second word line, each of the first memory cell and the second memory cell corresponding to a first column address;
    a first sense amplifier unit;
    a first bit line connected between the first memory cell and the first sense amplifier unit; and
    a second bit line connected between the second memory cell and the first sense amplifier unit, wherein the first bit line and the second bit line are located between the first and second word lines and the first sense amplifier in the first direction.

2. The memory device according to claim 1, wherein the first and second bit lines are located between the first and second memory cells and the first sense amplifier unit.

3. The memory device according to claim 1, wherein a first end of the first bit line and a second end of the second bit line are provided outside the first sense amplifier unit when viewed in a first direction.

4. The memory device according to claim 1, wherein:
    the first word line is connected to the first memory cell; and
    the second word line is connected to the second memory cell,
    wherein a first end of the first bit line and a second end of the second bit line are located between the first word line and the second word line when viewed in the first direction, the first direction intersecting with the first word line and the second word line.

5. The memory device according to claim 4, wherein the first end and the second end are provided at positions overlapping with the first sense amplifier unit when viewed in the first direction.

6. The memory device according to claim 4, further comprising:
    a third memory cell and a fourth memory cell, each of the third memory cell and the fourth memory cell corresponding to a second column address;
    a third word line connected to the third memory cell;
    a fourth word line connected to the fourth memory cell;
    a second sense amplifier unit parallel to the first sense amplifier unit in the second direction;
    a third bit line connected between the third memory cell and the second sense amplifier unit; and
    a fourth bit line connected between the fourth memory cell and the second sense amplifier unit,
    wherein a third end of the third bit line and a fourth end of the fourth bit line are located between the third word line and the fourth word line when viewed in the first direction.

7. The memory device according to claim 6, wherein the third end and the fourth end are provided at positions overlapping with the second sense amplifier unit when viewed in the first direction.

8. The memory device according to claim 6, further comprising:
    a fifth memory cell corresponding to the second column address and connected to the first word line; and
    a sixth memory cell corresponding to the second column address and connected to the second word line,
    wherein the third bit line is further connected between each of the fifth memory cell and the sixth memory cell and the second sense amplifier unit.

9. The memory device according to claim 6, further comprising:
    a fifteenth memory cell corresponding to the second column address and connected to the first word line;
    a sixteenth memory cell corresponding to the second column address and connected to the second word line;
    a thirteenth bit line connected between the fifteenth memory cell and the second sense amplifier unit; and
    a first wiring connected between the third bit line and the thirteenth bit line,
    wherein a thirteenth end of the thirteenth bit line and a fourteenth end of the first wiring are located between the first word line and the second word line when viewed in the first direction.

10. The memory device according to claim 9, wherein the first end, the second end, the thirteenth end, and the fourteenth end are provided at positions overlapping with the first sense amplifier unit when viewed in the first direction.

11. The memory device according to claim 4, further comprising:
- a ninth memory cell corresponding to a fourth column address and connected to the first word line;
- a tenth memory cell corresponding to the fourth column address and connected to the second word line;
- a fourth sense amplifier unit adjacent to the first sense amplifier unit in a second direction, the second direction intersecting with the first direction;
- a seventh bit line connected between the ninth memory cell and the fourth sense amplifier unit, the seventh bit line adjacent to the first bit line in a third direction, the third direction intersecting with the first direction and the second direction; and
- an eighth bit line connected between the tenth memory cell and the fourth sense amplifier unit, the eighth bit line adjacent to the second bit line in the third direction,
- wherein a seventh end of the seventh bit line and an eighth end of the eighth bit line are located between the first word line and the second word line when viewed in the first direction.

12. The memory device according to claim 11, wherein the first end, the second end, the seventh end, and the eighth end are provided at positions overlapping with at least one of the first sense amplifier unit or the fourth sense amplifier unit when viewed in the first direction.

13. The memory device according to claim 11, further comprising:
- an eleventh memory cell corresponding to a fifth column address and connected to the first word line;
- a twelfth memory cell corresponding to the fifth column address and connected to the second word line;
- a thirteenth memory cell corresponding to a sixth column address and connected to the first word line;
- a fourteenth memory cell corresponding to the sixth column address and connected to the second word line;
- a fifth sense amplifier unit arranged on a side opposite to the fourth sense amplifier unit with respect to the first sense amplifier unit;
- a sixth sense amplifier unit arranged on a side opposite to the first sense amplifier unit with respect to the fourth sense amplifier unit;
- a ninth bit line connected between the eleventh memory cell and the fifth sense amplifier unit, the ninth bit line adjacent to the seventh bit line in the third direction;
- a tenth bit line connected between the twelfth memory cell and the fifth sense amplifier unit, the tenth bit line adjacent to the eighth bit line in the third direction;
- an eleventh bit line connected between the thirteenth memory cell and the sixth sense amplifier unit, the eleventh bit line adjacent to the ninth bit line in the third direction; and
- a twelfth bit line connected between the fourteenth memory cell and the sixth sense amplifier unit, the twelfth bit line adjacent to the tenth bit line in the third direction,
- wherein a ninth end of the ninth bit line, a tenth end of the tenth bit line, an eleventh end of the eleventh bit line, and a twelfth end of the twelfth bit line are located between the first word line and the second word line when viewed in the first direction.

14. The memory device according to claim 13, wherein the first end, the second end, the seventh end, the eighth end, the ninth end, the tenth end, the eleventh end, and the twelfth end are provided at positions overlapping with at least one of the first sense amplifier unit or the fourth sense amplifier unit when viewed in the first direction.

15. The memory device according to claim 4, further comprising:
- a seventeenth memory cell and an eighteenth memory cell each corresponding to a seventh column address;
- a seventh sense amplifier unit parallel to the first sense amplifier unit in a second direction, the second direction intersecting with the first direction;
- a fifteenth bit line connected between the seventeenth memory cell and the seventh sense amplifier unit; and
- a sixteenth bit line connected between the eighteenth memory cell and the seventh sense amplifier unit,
- wherein the first bit line and the second bit line are arranged in the second direction,
- the fifteenth bit line and the sixteenth bit line are arranged in the second direction, and
- the fifteenth bit line is adjacent to each of the first bit line and the second bit line in a third direction, the third direction intersecting with the first direction and the second direction.

16. The memory device according to claim 15, further comprising:
- a nineteenth memory cell and a twentieth memory cell each of the nineteenth memory cell and the twentieth memory cell corresponding to an eighth column address;
- an eighth sense amplifier unit parallel to the first sense amplifier unit and the seventh sense amplifier unit in the second direction;
- a seventeenth bit line connected between the nineteenth memory cell and the eighth sense amplifier unit; and
- an eighteenth bit line connected between the twentieth memory cell and the eighth sense amplifier unit,
- wherein the seventeenth bit line and the eighteenth bit line are arranged in the second direction, and
- the fifteenth bit line is further adjacent to each of the seventeenth bit line and the eighteenth bit line in the third direction.

17. A memory device comprising:
- a first memory cell and a second memory cell, each of the first memory cell and the second memory cell corresponding to a first column address;
- a first sense amplifier unit;
- a first bit line connected between the first memory cell and the first sense amplifier unit;
- a second bit line connected between the second memory cell and the first sense amplifier unit;
- a third memory cell and a fourth memory cell, each of the third memory cell and the fourth memory cell corresponding to a second column address;
- a third word line connected to the third memory cell;
- a fourth word line connected to the fourth memory cell;
- a second sense amplifier unit parallel to the first sense amplifier unit in a second direction, the second direction intersecting with the first direction;
- a third bit line connected between the third memory cell and the second sense amplifier unit;
- a fourth bit line connected between the fourth memory cell and the second sense amplifier unit,
- wherein a third end of the third bit line and a fourth end of the fourth bit line are located between the third word line and the fourth word line when viewed in the first direction;
- a seventh memory cell corresponding to a third column address and connected to the first word line;
- an eighth memory cell corresponding to the third column address and connected to the second word line;

a third sense amplifier unit parallel to the first sense amplifier unit in a third direction, the third direction intersecting with the first direction and the second direction;

a fifth bit line connected between the seventh memory cell and the third sense amplifier unit; and a sixth bit line connected between the eighth memory cell and the third sense amplifier unit, wherein a fifth end of the fifth bit line and a sixth end of the sixth bit line are located between the first word line and the second word line when viewed in the first direction.

18. The memory device according to claim 17, wherein the fifth end and the sixth end are provided at positions overlapping with the third sense amplifier unit when viewed in the first direction.

19. A memory device comprising:

a first memory cell and a second memory cell, each of the first memory cell and the second memory corresponding to a first column address;

a first sense amplifier unit;

a first bit line connected between the first memory cell and the first sense amplifier unit; and a second bit line connected between the second memory cell and the first sense amplifier unit;

wherein a first end of the first bit line and a second end of the second bit line are provided outside the first sense amplifier unit when viewed in a first direction;

a second wiring connected between the first bit line and the first sense amplifier unit; and a third wiring connected between the second bit line and the first sense amplifier unit, wherein the first bit line and the second bit line are arranged in a second direction, the second direction intersecting with the first direction, and each of the second wiring and the third wiring has a portion extending in a third direction, the third direction intersecting with the first direction and the second direction.

* * * * *